(12) United States Patent
Sasaki et al.

(10) Patent No.: US 8,258,585 B2
(45) Date of Patent: Sep. 4, 2012

(54) SEMICONDUCTOR DEVICE

(75) Inventors: Yuichiro Sasaki, Osaka (JP); Katsumi Okashita, Osaka (JP); Keiichi Nakamoto, Osaka (JP); Bunji Mizuno, Nara (JP)

(73) Assignee: Panasonic Corporation, Osaka (JP)

( * ) Notice: Subject to any disclaimer, the term of this patent is extended or adjusted under 35 U.S.C. 154(b) by 163 days.

(21) Appl. No.: 12/676,102

(22) PCT Filed: Apr. 30, 2009

(86) PCT No.: PCT/JP2009/001974
§ 371 (c)(1),
(2), (4) Date: Mar. 2, 2010

(87) PCT Pub. No.: WO2009/144874
PCT Pub. Date: Dec. 3, 2009

(65) Prior Publication Data
US 2010/0207211 A1 Aug. 19, 2010

(30) Foreign Application Priority Data
May 29, 2008 (JP) .................................. 2008-140909

(51) Int. Cl.
*H01L 27/088* (2006.01)
(52) U.S. Cl. .................. 257/401; 257/E29.022; 438/284
(58) Field of Classification Search .................. 257/296, 257/327, 344, 347, E29.273, 401, E29.022; 438/197, 206, 284
See application file for complete search history.

(56) References Cited

U.S. PATENT DOCUMENTS

| | | | |
|---|---|---|---|
| 2004/0262688 A1* | 12/2004 | Nowak et al. | 257/350 |
| 2006/0157749 A1* | 7/2006 | Okuno | 257/288 |
| 2006/0208300 A1* | 9/2006 | Iwanaga et al. | 257/308 |
| 2007/0096196 A1 | 5/2007 | Hofmann et al. | |
| 2007/0096198 A1* | 5/2007 | Hofmann et al. | 257/316 |
| 2008/0096337 A1* | 4/2008 | Tigelaar | 438/197 |
| 2008/0237710 A1* | 10/2008 | Ban et al. | 257/347 |

FOREIGN PATENT DOCUMENTS

| | | |
|---|---|---|
| DE | 10 2006 003 392 A1 | 5/2007 |
| JP | 2006-196821 | 7/2006 |
| JP | 2007-059427 | 3/2007 |
| WO | WO 2004/084292 A1 | 9/2004 |

OTHER PUBLICATIONS

D. Lenoble et al., "Enhanced performance of PMOS MUGFET via integration of conformal plasma-doped source/drain extensions," 2006 Symposium on VLSI Technology Digest of Technical Papers, pp. 212.

* cited by examiner

*Primary Examiner* — William F Kraig
(74) *Attorney, Agent, or Firm* — McDermott Will & Emery LLP

(57) ABSTRACT

A semiconductor device includes: a fin-type semiconductor region (13) formed on a substrate (11); a gate insulating film (14) formed so as to cover an upper surface and both side surfaces of a predetermined portion of the fin-type semiconductor region (13); a gate electrode (15) formed on the gate insulating film (14); and an impurity region (17) formed on both sides of the gate electrode (15) in the fin-type semiconductor region (13). An impurity blocking portion (15a) for blocking the introduction of impurities is provided adjacent both sides of the gate electrode (15) over an upper surface of the fin-type semiconductor region (13).

45 Claims, 16 Drawing Sheets

SEMICONDUCTOR DEVICE

RELATED APPLICATIONS

This application is the U.S. National Phase under 35 U.S.C. §371 of International Application No. PCT/JP2009/001974, filed on Apr. 30, 2009, which in turn claims the benefit of Japanese Application No. 2008-140909, filed on May 29, 2008, the disclosures of which Applications are incorporated by reference herein.

TECHNICAL FIELD

The present invention generally relates to semiconductor devices. More particularly, the present invention relates to a semiconductor device of a three-dimensional structure having a fin-shaped semiconductor region on a substrate.

BACKGROUND ART

With recent improvement in integration density, performance, and operation speed of semiconductor devices, there has been a growing demand for smaller semiconductor devices. In response to this demand, various device structures have been proposed to reduce the area occupied by transistors on a substrate. Among others, field effect transistors having a fin-type structure have attracted attention as a device structure implementing a reduced occupied area. The field effect transistors having a fin-type structure are generally called fin-type field effect transistors (FETs). The fin-type field effect transistors have an active region made of a thin, wall (fin)-shaped semiconductor region (hereinafter, referred to as a fin-type semiconductor region) extending perpendicularly to a principal surface of a substrate. Since the side surfaces of the fin-type semiconductor region can be used as a channel plane, the occupied area of the transistor on the substrate can be reduced (see, e.g., PATENT DOCUMENT 1).

Examples of a method for introducing impurities into the upper and side surfaces of a fin-type semiconductor region include an ion implantation method and a plasma doping method. Recent study shows that conformal doping of the upper and side surfaces of the fin-type semiconductor region improves characteristics of fin-type FETs, and a plasma doping method has gained attention as a method of conformal doping. For example, pulsed DC (Direct Current) plasma technology has been proposed as a plasma doping method used for conformal doping (see NON-PATENT DOCUMENT 1).

FIG. 12 is a schematic perspective view showing the shapes of impurity regions right after a doping process for forming extension regions was performed in a manufacturing process of a fin-type FET in which a fin-type semiconductor region has a relatively large length in the gate width direction. In this example, the length of the fin-type semiconductor region in the gate width direction is about the same as the height of the fin-type semiconductor region (length in the gate width direction:height=1:1). As shown in FIG. 12, a gate insulating film 104 is formed so as to cover the upper surface and both side surfaces of a predetermined portion of a fin-type semiconductor region 100, and a gate electrode 105 is formed on the gate insulating film 104. Impurity regions 101, 102, and 103 are formed in a part of the fin-type semiconductor region 100 which is not covered by the gate electrode 105. The impurity region 101 is formed in the upper part of the non-covered part of the fin-type semiconductor region 100, the impurity region 102 is formed in the left side of the non-covered part of the fin-type semiconductor region 100, and the impurity region 103 is formed in the right side of the non-covered part of the fin-type semiconductor region 100. Note that the fin-type semiconductor region 100 has a length of 65 nm in the gate width direction and a height of 65 nm. The gate electrode 105 has a gate length of 38 nm.

FIG. 13 is a schematic perspective view showing the shapes of the impurity regions after the fin-type FET of FIG. 12 (which had already been subjected to the doping process) was annealed. As shown in FIG. 13, impurities in the impurity region 101 of FIG. 12 diffuse to form an impurity region 111 in the upper part of the fin-type semiconductor region 100. Impurities in the impurity region 102 of FIG. 12 diffuse to form an impurity region 112 in the left side of the fin-type semiconductor region 100, and impurities in the impurity region 103 of FIG. 12 diffuse to form an impurity region 113 in the right side of the fin-type semiconductor region 100. In this annealing process, impurities in the impurity regions 101 and 102 of FIG. 12 diffuse intensively into the upper left corner of the fin-type semiconductor region 100, and impurities in the impurity regions 101 and 103 of FIG. 12 diffuse intensively into the upper right corner of the fin-type semiconductor region 100. As a result, relatively highly doped impurity regions 114 and 115 are formed in the upper left corner and the upper right corner of the fin-type semiconductor region 100, respectively.

In the fin-type FET of FIG. 13, an ON-state current flows intensively in the upper left corner and the upper right corner of the fin-type semiconductor region 100. In other words, the fin-type FET of FIG. 13 has an uneven ON-state current, although the uneven impurity concentration in the extension regions has not been identified as a cause of this problem.

Regarding this problem, it has been reported that operation reliability of the fin-type FET is ensured by providing a curvature to the upper corners of the fin-type semiconductor region.

CITATION LIST

Patent Document

PATENT DOCUMENT 1: Japanese Patent Laid-Open Publication No. 2006-196821

Non-Patent Document

NON-PATENT DOCUMENT 1: D. Lenoble et al., Enhanced performance of PMOS MUGFET via integration of conformal plasma-doped source/drain extensions, 2006 Symposium on VLSI Technology Digest of Technical Papers, p. 212

SUMMARY OF THE INVENTION

Technical Problem

However, the conventional manufacturing method of the semiconductor device disclosed in PATENT DOCUMENT 1, NON-PATENT DOCUMENT 1, or the like has the following problem: the fin-type FET is less likely to have desired transistor characteristics as the length of the fin-type semiconductor region in the gate width direction becomes smaller relative to the height thereof.

In view of the above problem, it is an object of the present invention to obtain desired characteristics in a semiconductor device having a fin-type semiconductor region even if the fin-type semiconductor region has a smaller length in the gate width direction.

Solution to the Problem

In order to achieve the above object, the inventors had investigated the reason why desired transistor characteristics cannot be obtained in the structure of the conventional fin-type FET and the manufacturing method thereof, and found the following facts:

FIG. 14 is a schematic perspective view showing the shapes of impurity regions right after a doping process for forming extension regions was performed in a manufacturing process of a fin-type FET in which a fin-type semiconductor region has a small length in the gate width region. In this example, the length of the fin-type semiconductor region in the gate width direction is about one third of the height of the fin-type semiconductor region (length in the gate width direction: height=1:3). As shown in FIG. 14, a gate insulating film 204 is formed so as to cover the upper surface and both side surfaces of a predetermined portion of a fin-type semiconductor region 200, and a gate electrode 205 is formed on the gate insulating film 204. Impurity regions 201, 202, and 203 are formed in a part of the fin-type semiconductor region 200 which is not covered by the gate electrode 205. The impurity region 201 is formed in the upper part of the non-covered part of the fin-type semiconductor region 200. The impurity region 202 is formed in the left side of the non-covered part of the fin-type semiconductor region 200. The impurity region 203 is formed in the right side of the non-covered part of the fin-type semiconductor region 200. Note that the fin-type semiconductor region 200 has a length of 22 nm in the gate width direction and a height of 65 nm. The gate electrode 205 has a gate length of 38 nm.

FIG. 15 is a schematic perspective view showing the shapes of the impurity regions after the fin-type FET of FIG. 14 (which had already been subjected to the doping process) was annealed. As shown in FIG. 15, impurities in the impurity region 201 of FIG. 14 diffuse to form an impurity region 211 in the upper part of the fin-type semiconductor region 200. Impurities in the impurity region 202 of FIG. 14 diffuse to form an impurity region 212 in the left side and the middle of the fin-type semiconductor region 200, and impurities in the impurity region 203 of FIG. 14 diffuse to form an impurity region 213 in the right side and the middle of the fin-type semiconductor region 200. In this annealing process, impurities in the impurity regions 202 and 203 of FIG. 14 diffuse intensively into the middle of the fin-type semiconductor region 200. Moreover, impurities in the impurity regions 201 and 202 of FIG. 14 diffuse intensively into the upper left corner of the fin-type semiconductor region 200, and impurities in the impurity regions 201 and 203 of FIG. 14 diffuse intensively into the upper right corner of the fin-type semiconductor region 200. As a result, relatively highly doped impurity regions 216, 214, and 215 are formed in the middle, the upper left corner, and the upper right corner of the fin-type semiconductor region 200, respectively.

The fin-type FET in which the fin-type semiconductor region has a small length in the gate width direction has also the following characteristics: in the annealing process, not only the impurities in the impurity region 201 of FIG. 14 but also the impurities in the impurity regions 202 and 203 of FIG. 14 diffuse intensively to form the impurity region 211 in the middle region of the upper part of the fin-type semiconductor region 200. In other words, the impurity region 211 formed in the middle region of the upper part of the fin-type semiconductor region 200 is the most highly doped impurity region containing the impurities intensively diffused from three directions.

Especially when impurities are introduced by a plasma doping method, the impurity concentration is higher at the topmost surface of a semiconductor region, i.e., the implantation surface, than in the inside of the semiconductor region. For example, FIG. 10 shows an SMIS (Secondary Ion Mass Spectrometry) measurement result of the relation between the implantation depth and the boron concentration. In this example, boron was implanted into a semiconductor region by a plasma doping method. As shown in FIG. 10, the impurity concentration is about $1 \times cm^{-3}$ at the topmost surface of the semiconductor region (implantation depth: 0 nm), while the impurity concentration is about $1 \times cm^{-3}$ at a depth of 5 nm from the topmost surface of the semiconductor region, which is about four digits smaller than the impurity concentration at the topmost surface of the semiconductor region. The topmost surface in the middle region of the upper part of the fin-type semiconductor region is therefore a region containing the largest amount of introduced impurities in the fin-type semiconductor region right after the plasma doping, and is also a region containing impurities intensively diffused from three directions, i.e., from the upper part and both sides of the fin-type semiconductor region, after the annealing process.

In the fin-type FET, the impurities introduced to the topmost surface in the middle region of the upper part of the fin-type semiconductor region therefore has the largest diffusion length into a portion of the fin-type semiconductor region located under the gate electrode (i.e., a portion where no impurity region is formed by the plasma doping). When the gate length is reduced, the distance between the source-side extension region and the drain-side extension region is therefore reduced due to this large diffusion length, causing a leakage current from the source side to the drain side. As a result, desired transistor characteristics cannot be obtained. FIGS. 16A through 16C illustrate a mechanism of generating the leakage current based on the above finding of the inventors. More specifically, FIGS. 16A, 16B, and 16C correspond to cross-sectional views taken along lines A-A, B-B, and C-C in FIG. 15, respectively. As shown in FIGS. 16A through 16C, the distance between the source-side extension region and the drain-side extension region (each extension region is formed by the impurity region 211) is the shortest in the middle region of the upper part of the fin-type semiconductor region 200, as compared to the respective distances in the upper left corner and the upper right corner of the fin-type semiconductor region 200.

As has been described above, according to the structure of the conventional fin-type FET and the method for forming the extension regions thereof, impurities more intensively diffuse into the topmost surface in the middle region of the upper part of the fin-type semiconductor region as the length of the fin-type semiconductor region in the gate width direction becomes smaller, thereby significantly increasing the impurity concentration. The extension regions in the middle region of the upper part of the fin-type semiconductor region therefore extends longer under the gate electrode than the extension regions in the upper corners and both sides of the fin-type semiconductor region. In other words, the distance between the source-side and drain-side extension regions is relatively long in the upper corners and both sides of the fin-type semiconductor region, while the distance between the source-side and drain-side extension regions is relatively short in the middle region of the upper part of the fin-type semiconductor region. When operation of the fin-type FET having such an extension structure is stopped, a leakage current is generated in the middle region of the upper part of the fin-type semiconductor region where the distance between the source-side and drain-side extension regions is short. As a result, desired transistor characteristics cannot be obtained.

Based on the above finding, the inventors arrived at the invention in which a portion for blocking introduction of impurities (hereinafter, referred to as a impurity blocking portion) is formed on both sides of a gate electrode over an upper surface of a fin-type semiconductor region, whereby an impurity region that is formed in the middle region of an upper part of the fin-type semiconductor region during doping is separated from a gate electrode, and impurities in the impurity region are prevented from entering a region under the gate electrode during annealing. With this structure, the distance between source-side and drain-side extension regions becomes about the same in the middle region of the upper part of the fin-type semiconductor region and in the upper corners and both sides of the fin-type semiconductor region. As a result, even if the fin-type semiconductor region has a reduced length in the gate width direction, generation of a leakage current is prevented, whereby desired transistor characteristics can be implemented.

Especially in a fin-type FET in which the length of a fin-type semiconductor region in the gate width direction is smaller than the height of the fin-type semiconductor region, impurities introduced into the upper part and both sides of the fin-type semiconductor region diffuse from the three directions intensively into the middle region of the upper part of the fin-type semiconductor region. In this case, source-side and drain-side extension regions may become too close and may almost contact each other in the middle region of the upper part of the fin-type semiconductor region. It is therefore very important to use the above-mentioned present invention to make the distance between the source-side and drain-side extension regions as equal as possible in the middle region of the upper part of the fin-type semiconductor region and in the upper corners and both sides of the fin-type semiconductor region.

Note that, as the impurity blocking portion of the present invention, for example, a protruding portion of a gate insulating film and a gate electrode may be formed by using double patterning technology or the like for gate patterning, and the protruding portion may be used as the impurity blocking portion. With this structure, the gate insulating film which covers the upper surface of the fin-type semiconductor region has a larger length in the gate length direction than that of the gate insulating film which covers the side surfaces of the fin-type semiconductor region. In this case, it is, as a matter of course, the gate electrode excluding the protruding portion which substantially functions as a gate electrode. In other words, the gate length defining the channel length is the gate length of the substantial gate electrode excluding the protruding portion.

More specifically, a semiconductor device according to the present invention includes: a fin-type semiconductor region formed on a substrate; a gate insulating film formed so as to cover an upper surface and both side surfaces of a predetermined portion of the fin-type semiconductor region; a gate electrode formed on the gate insulating film; an impurity region formed on both sides of the gate electrode in the fin-type semiconductor region; and an impurity blocking portion for blocking the introduction of impurities. The impurity blocking portion is provided adjacent both sides of the gate electrode over an upper surface of the fin-type semiconductor region.

In the semiconductor device of the present invention, the impurity blocking portion may be formed as a part of the gate electrode, the impurity blocking portion being a protruding portion of the gate electrode. In this case, the manufacturing process can be simplified as compared to the case where the impurity blocking portion is formed by using a material other than a gate electrode material.

In the semiconductor device of the present invention, a dimension of the impurity blocking portion in a gate width direction is preferably smaller than that of the fin-type semiconductor region in the gate width direction. In this case, the impurity blocking portion can be reliably formed only over the upper surface of the fin-type semiconductor region even if misalignment occurs in a lithography process.

In the semiconductor device of the present invention, a dimension of the gate electrode in a gate length direction may be 45 nm or less. In this case, the effect of the impurity blocking portion of the present invention, that is, the effect of preventing the source-side and drain-side extension regions from becoming close to each other, becomes significant.

In the semiconductor device of the present invention, a specific resistance of the impurity region formed in a side of the fin-type semiconductor region is preferably no more than twice (if possible, at most 1.25 times) a specific resistance of the impurity region formed in an upper part of the fin-type semiconductor region. In this case, excellent transistor characteristics can be obtained in a fin-type FET in which the length of the fin-type semiconductor region in the gate width direction is smaller than the height of the fin-type semiconductor region.

In the semiconductor device of the present invention, a sheet resistance of the impurity region formed in a side of the fin-type semiconductor region is preferably no more than twice (if possible, at most 1.25 times) a sheet resistance of the impurity region formed in an upper part of the fin-type semiconductor region. In this case, excellent transistor characteristics can be obtained in a fin-type FET in which the length of the fin-type semiconductor region in the gate width direction is smaller than the height of the fin-type semiconductor region.

In the semiconductor device of the present invention, a spreading resistance of the impurity region formed in a side of the fin-type semiconductor region is preferably no more than twice (if possible, at most 1.25 times) a spreading resistance of the impurity region formed in an upper part of the fin-type semiconductor region. In this case, excellent transistor characteristics can be obtained in a fin-type FET in which the length of the fin-type semiconductor region in the gate width direction is smaller than the height of the fin-type semiconductor region.

In the semiconductor device of the present invention, an insulating layer may be formed between the substrate and the fin-type semiconductor region. The substrate may be a semiconductor substrate having a protrusion which serves as the fin-type semiconductor region.

In the semiconductor device of the present invention, the impurity region is basically an extension region. If no extension region is formed, the impurity region may be a source/drain region.

In the semiconductor device of the present invention, an insulating sidewall spacer may be formed on a side surface of the gate electrode. In this case, the insulating sidewall spacer may be formed on a side surface of the impurity blocking portion. Another impurity region, for example, a source/drain region, may be formed in the fin-type semiconductor region on both sides of the insulating sidewall spacer when viewed from the gate electrode.

In the semiconductor device of the present invention, a height of the fin-type semiconductor region may be larger than a dimension of the fin-type semiconductor region in a gate width direction. In this case, the effect of the impurity blocking portion of the present invention, that is, the effect of preventing the source-side and drain-side extension regions from becoming close to each other, becomes significant.

In the semiconductor device of the present invention, a plurality of fin-type semiconductor regions may be formed over the substrate at a predetermined pitch, the gate electrode may be formed so as to extend across each of the fin-type semiconductor regions, and there may be no impurity blocking portion formed between the fin-type semiconductor regions.

In the semiconductor device of the present invention, the impurity blocking portion may include a material which is different from the material of the gate electrode. In this case, the impurity blocking portion may be formed of an insulating material, the gate electrode may have a substantially uniform gate length in a gate width direction, or an insulating sidewall spacer may be formed on a side surface of the impurity blocking portion.

In the semiconductor device of the present invention, a length of the fin-type semiconductor region in a gate width direction may be about one third of a height of the fin-type semiconductor region.

In the semiconductor device of the present invention, the impurity region may include a source-side extension region and a drain-side extension region, and the distance between the source-side extension region and the drain-side extension region may be substantially the same in a middle region of an upper part of the fin-type semiconductor region, and in upper corners and sides of the fin-type semiconductor region.

A method of forming a semiconductor device of the present invention includes: forming a fin-type semiconductor region on a substrate; forming a gate insulating film so as to cover an upper surface and both side surfaces of a predetermined portion of the fin-type semiconductor region; forming a gate electrode on the gate insulating film; forming an impurity blocking portion adjacent both sides of the gate electrode over an upper surface of the fin-type semiconductor region, the impurity blocking portion operable for blocking the introduction of impurities, and forming an impurity region on both sides of the gate electrode in the fin-type semiconductor region.

In the method of forming a semiconductor device of the present invention, the impurity blocking portion may be formed as part of the gate electrode, the impurity blocking portion being a protruding portion of the gate electrode. In this case, the manufacturing process can be simplified as compared to the case where the impurity blocking portion is formed by using a material other than a gate electrode material.

In the method of forming a semiconductor device of the present invention, a dimension of the impurity blocking portion in a gate width direction is preferably smaller than that of the fin-type semiconductor region in the gate width direction. In this case, the impurity blocking portion can be reliably formed only over the upper surface of the fin-type semiconductor region even if misalignment occurs in a lithography process.

In the method of forming a semiconductor device of the present invention, the impurity blocking portion may include a material which is different from the material of the gate electrode. In this case, the impurity blocking portion may be formed of an insulating material, or the gate electrode may have a substantially uniform gate length in a gate width direction. Alternatively, an insulating sidewall spacer may be formed on a side surface of the impurity blocking portion. Further, in this case, the impurity blocking portion may be removed after forming the impurity region.

In the method of forming a semiconductor device of the present invention, a length of the fin-type semiconductor region in a gate width direction may be about one third of a height of the fin-type semiconductor region.

In the method of forming a semiconductor device of the present invention, the impurity region may include a source-side extension region and a drain-side extension region, and the distance between the source-side extension region and the drain-side extension region may be substantially the same in a middle region of an upper part of the fin-type semiconductor region, and in upper corners and sides of the fin-type semiconductor region.

In the method of forming a semiconductor device of the present invention, if a dimension of the gate electrode in a gate length direction may be 45 nm or less, the effect of the impurity blocking portion of the present invention, that is, the effect of preventing the source-side and drain-side extension regions from becoming close to each other, becomes significant.

In the method of forming a semiconductor device of the present invention, a specific resistance of the impurity region formed in a side of the fin-type semiconductor region is preferably no more than twice (if possible, at most 1.25 times) a specific resistance of the impurity region formed in an upper part of the fin-type semiconductor region. In this case, excellent transistor characteristics can be obtained in a fin-type FET in which the length of the fin-type semiconductor region in the gate width direction is smaller than the height of the fin-type semiconductor region.

In the method of forming a semiconductor device of the present invention, sheet resistance of the impurity region formed in a side of the fin-type semiconductor region is preferably no more than twice (if possible, at most 1.25 times) a sheet resistance of the impurity region formed in an upper part of the fin-type semiconductor region. In this case, excellent transistor characteristics can be obtained in a fin-type FET in which the length of the fin-type semiconductor region in the gate width direction is smaller than the height of the fin-type semiconductor region.

In the method of forming a semiconductor device of the present invention, a spreading resistance of the impurity region formed in a side of the fin-type semiconductor region is preferably no more than twice (if possible, 1.25 times) a spreading resistance of the impurity region formed in an upper part of the fin-type semiconductor region. In this case, excellent transistor characteristics can be obtained in a fin-type FET in which the length of the fin-type semiconductor region in the gate width direction is smaller than the height of the fin-type semiconductor region.

In the method of forming a semiconductor device of the present invention, an insulating layer may be formed between the substrate and the fin-type semiconductor region. The substrate may be a semiconductor substrate having a protrusion which serves as the fin-type semiconductor region.

In the method of forming a semiconductor device of the present invention, the impurity region is basically an extension region. If no extension region is formed, the impurity region may be a source/drain region.

In the method of forming a semiconductor device of the present invention, an insulating sidewall spacer may be formed on a side surface of the gate electrode. In this case, the insulating sidewall spacer may be formed on a side surface of the impurity blocking portion. Another impurity region, for example, a source/drain region, may be formed in the fin-type semiconductor region on both sides of the insulating sidewall spacer when viewed from the gate electrode.

In the method of forming a semiconductor device of the present invention, a height of the fin-type semiconductor region may be larger than a dimension of the fin-type semiconductor region in a gate width direction. In this case, the effect of the impurity blocking portion of the present invention, that is, the effect of preventing the source-side and drain-side extension regions from becoming close to each other, becomes significant.

The method of forming a semiconductor device of the present invention may further include forming a plurality of fin-type semiconductor regions over the substrate at a predetermined pitch. The gate electrode may be formed so as to extend across each of the fin-type semiconductor regions, and there may be no impurity blocking portion formed between the fin-type semiconductor regions.

Another semiconductor device of the present invention includes: a fin-type semiconductor region formed on a substrate; and a gate electrode formed so as to extend across the fin-type semiconductor region in a gate width direction, the gate electrode having an upper portion formed on an upper portion of the fin-type semiconductor region and side portions formed on side portions of the fin-type semiconductor region, the upper portion of the gate electrode having a length in a gate length direction greater than that of the side portions of the gate electrode.

In the above semiconductor device of the present invention, the upper portion of the gate electrode may include a protrusion portion having a length corresponding to the length of the upper portion in the gate length direction and another portion having a length in the gate length direction corresponding to the length of the side portions of the gate electrode.

In the above semiconductor device of the present invention, a length of the fin-type semiconductor region in the gate width direction may be about one third of a height of the fin-type semiconductor region.

Advantages of the Invention

According to the present invention, the impurity blocking portion is provided on both sides of the gate electrode over the upper surface of the fin-type semiconductor region. As a result, the impurity region which is formed in the middle region of the upper part of the fin-type semiconductor region during doping can be separated from the gate electrode. Impurities in the impurity region can therefore be prevented from diffusing into a region under the gate electrode during annealing. Accordingly, the distance between source-side and drain-side extension regions becomes about the same in the middle region of the upper part of the fin-type semiconductor region and in the upper corners and both sides of the fin-type semiconductor region. Degradation in characteristics such as generation of a leakage current can be prevented even if the fin-type semiconductor region has a reduced length in the gate width direction in a three-dimensional device such as a fin-type FET.

BRIEF DESCRIPTION OF THE DRAWINGS

FIG. 1A is a plan view, FIG. 1B is a cross-sectional view taken along line A-A in FIG. 1A, FIG. 1C is a cross-sectional view taken along line B-B in FIG. 1A, FIG. 1D is a cross-sectional view taken along line C-C in FIG. 1A, and FIG. 1E is a cross-sectional view taken along line D-D in FIG. 1A;

FIG. 11A is a plan view, FIG. 11B is a cross-sectional view taken along line A-A in FIG. 11A, FIG. 11C is a cross-sectional view taken along line B-B in FIG. 11A, FIG. 11D is a cross-sectional view taken along line C-C in FIG. 11A, and FIG. 11E is a cross-sectional view taken along line D-D in FIG. 11A;

DESCRIPTION OF EMBODIMENTS

First Example Embodiment

Hereinafter, a semiconductor device and a manufacturing method thereof according to a first example embodiment of the present invention will be described with reference to the accompanying drawings.

Figure 1A:
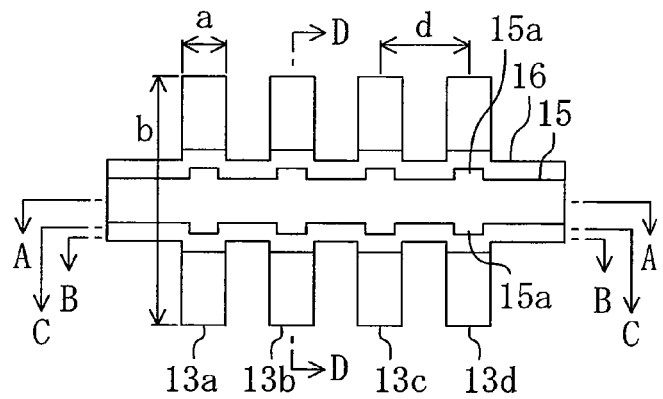
FIGS. 1A, 1B, 1C, 1D, and 1E are diagrams showing a structure of a semiconductor device according to a first example embodiment of the present invention, where
Figure 1B:
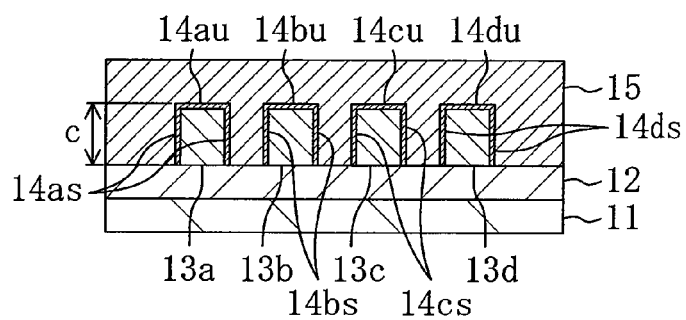
Figure 1C:
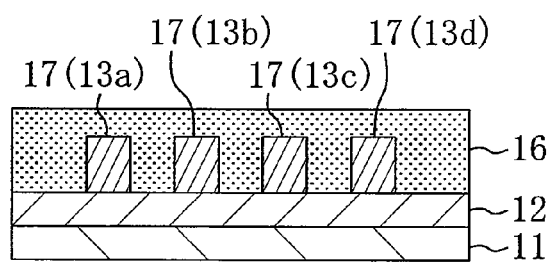
Figure 1D:
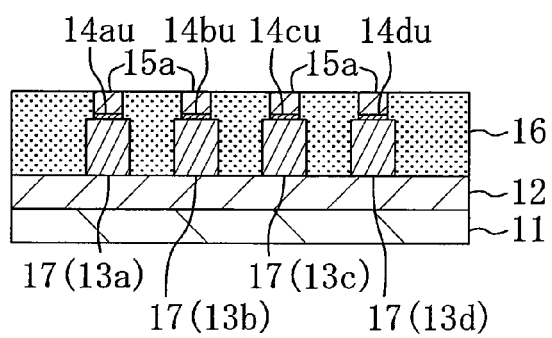
Figure 1E:
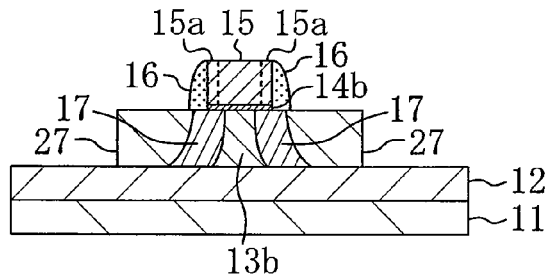

FIGS. 1A, 1B, 1C, 1D, and 1E are diagrams showing a structure of a semiconductor device according to a first example embodiment of the present invention, and more specifically, a semiconductor device having fin-type FETs. FIG. 1A is a plan view, FIG. 1B is a cross-sectional view taken along line A-A in FIG. 1A, FIG. 1C is a cross-sectional view taken along line B-B in FIG. 1A, FIG. 1D is a cross-sectional view taken along line C-C in FIG. 1A, and FIG. 1E is a cross-sectional view taken along line D-D in FIG. 1A.

As shown in FIGS. 1A thorough 1E, the fin-type FETs of the present example embodiment includes a support substrate 11, an insulating layer 12, fin-type semiconductor regions 13a through 13d, gate insulating films 14a through 14d, a gate electrode 15, insulating sidewall spacers 16, extension regions 17, and source/drain regions 27. The support substrate 11 is made of, for example, silicon. The insulating layer 12 is formed on the support substrate 11 and made of, for example, silicon oxide. The fin-type semiconductor regions 13a through 13d are formed on the insulating layer 12. The gate insulating films 14a through 14d are made of, for example, a silicon oxynitride film and are formed so as to cover the upper surface and both side surfaces of predetermined portions of the fin-type semiconductor regions 13a through 13d, respectively. The gate electrode 15 is formed on the gate insulating films 14a through 14d. The insulating sidewall spacers 16 are formed on the side surfaces of the gate electrode 15. The extension regions 17 are formed on both sides of the gate electrode 15 in each fin-type semiconductor region 13a through 13d. The source/drain regions 27 are formed on both sides of the gate electrode 15 and the insulating sidewall spacers 16 in each fin-type semiconductor region 13a through 13d.

Each fin-type semiconductor region 13a through 13d has a length "a" of, for example, about 22 nm in the gate width direction, a length "b" of, for example, about 350 nm in the gate length direction, and a height (thickness) "c" of, for example, about 65 nm. The fin-type semiconductor regions 13a through 13d are arranged on the insulating layer 12 at a pitch "d" (e.g., about 30 nm) in the gate width direction. Note that the upper surface and the side surfaces of each fin-type semiconductor region 13a through 13d may be, but not necessarily, perpendicular to each other.

For convenience of the description, it is herein assumed that gate insulating films 14au through 14du are respectively formed on the upper surface of the fin-type semiconductor regions 13a through 13d, gate insulating films 14as through 14ds are respectively formed on the side surfaces of the fin-type semiconductor regions 13a through 13d, and each of the gate insulating films 14a through 14d is formed by a corresponding one of the gate insulating films 14au through 14du and a corresponding one of the gate insulating films 14as through 14ds. However, the gate insulating films 14au, 14as, the gate insulating films 14bu, 14bs, the gate insulating films 14cu, 14cs, and the gate insulating films 14du, 14ds are actually formed integrally. The gate electrode 15 is formed so as to extend across the fin-type semiconductor regions 13a through 13d in the gate width direction. Note that description and illustration of pocket regions will be omitted.

The present example embodiment is characterized in that protruding portions 15a are formed on both sides of the gate electrode 15 over the upper surface of the fin-type semiconductor regions 13a through 13d, respectively. No protruding portion 15a of the gate electrode 15 is formed in regions between fin-type semiconductor regions 13a through 13d. Each protruding portion 15a has a length of about 18 nm in the gate width direction, which is smaller than the length "a" (about 22 nm) of each fin-type semiconductor region 13a through 13d in the gate width direction. Each protruding portion 15a has a protruding length of about 5 nm in the gate length direction, and has a thickness of about 60 nm, which is the same as that of the gate electrode 15.

Note that the gate insulating films 14au through 14du are respectively present under the protruding portions 15a of the gate electrode 15 on the upper surface of the fin-type semiconductor regions 13a through 13d. In other words, the gate insulating films 14au through 14du formed on the upper surface of the fin-type semiconductor regions 13a through 13d have a larger length in the gate length direction than the length in the gate direction of the gate insulating films 14as through 14ds formed on the side surfaces of the fin-type semiconductor regions 13a through 13d. For example, the gate insulating films 14as through 14ds have a length of about 38 nm in the gate length direction, which is the same as the gate length of the gate electrode 15 excluding the protruding portions 15a. The gate insulating films 14au through 14du have a length of about 48 nm which is the sum of the gate length (38 nm) and the protruding length on both sides (5 nm×2). The insulating sidewall spacers 16 are formed also on the side surfaces of the protruding portions 15a of the gate electrode 15.

In the example embodiment described above, the protruding portions 15a are formed as impurity blocking portions on both sides of the gate electrode 15 over the upper surface of the fin-type semiconductor regions 13a through 13d. Impurity regions formed in the middle regions of the upper parts of the fin-type semiconductor region 13a through 13d in a doping process can thus be separated from the gate electrode 15. Impurities in the impurity regions can therefore be prevented from diffusing into a region under the gate electrode 15 in an annealing process. In other words, the distance between source-side and drain-side extension regions 17 can be prevented from being reduced in the middle region of the upper part of each fin-type semiconductor region 13a through 13d due to intensive diffusion of impurities caused in an annealing process. The distance between the source-side and drain-side extension regions 17 is thus about the same in the middle regions of the upper parts of the fin-type semiconductor regions 13a through 13d and in the upper corners and both sides of the fin-type semiconductor regions 13a through 13d.

Accordingly, degradation in characteristics such as generation of a leakage current can be prevented even if the fin-type semiconductor regions 13a through 13d have a smaller length in the gate width direction.

In the present example embodiment, the gate length of the gate electrode 15 is set to 45 nm or less and the fin-type semiconductor regions 13a through 13d have a larger height than their length in the gate width direction. The above effect of preventing degradation in characteristics becomes significant especially in the case where a three-dimensional device such as a fin-type FET is reduced in dimensions by using such a gate electrode 15 and such fin-type semiconductor regions 13a through 13d.

Figure 2A:
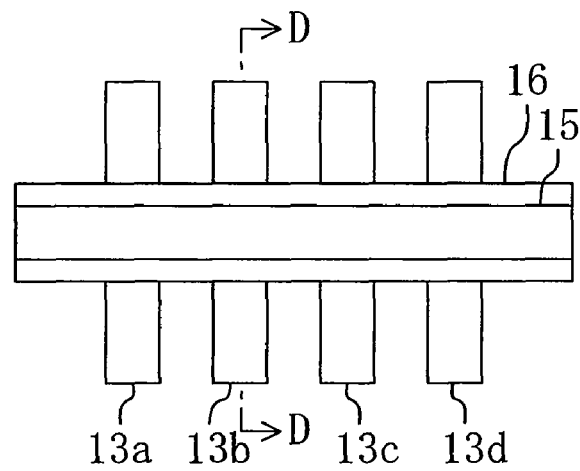
FIG. 2A is a plan view showing, as a comparative example, a structure of a semiconductor device having fin-type FETs with no protruding portion of the gate electrode of the present invention.
Figure 2B:
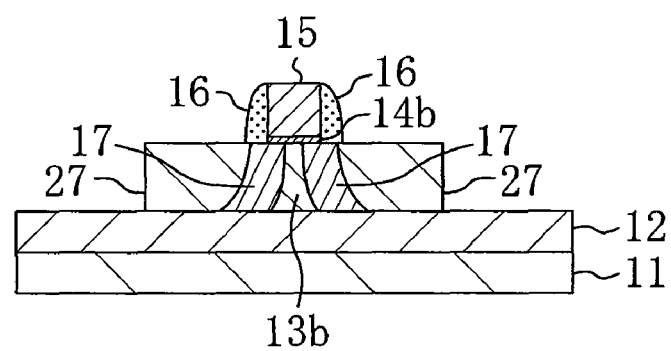
FIG. 2B is a cross-sectional view taken along line D-D in FIG. 2A.

FIG. 2A is a plan view showing, as a comparative example, a structure of a semiconductor device having fin-type FETs with no protruding portion 15a of the gate electrode 15 of the present invention. FIG. 2B is a cross-sectional view taken along line D-D in FIG. 2A. Note that the semiconductor device of FIG. 2A has the same cross-sectional view as that of FIG. 1B along line A-A, and has the same cross-sectional view as that of FIG. 1C along lines B-B and C-C. As shown in FIGS. 2A and 2B, when the gate electrode 15 has no protruding portion 15a as an impurity blocking portion, impurity regions formed in the middle regions of the upper parts of the fin-type semiconductor regions 13a through 13d in a doping process become adjacent to the gate electrode 15. Impurities in these impurity regions therefore diffuse into a region under the gate electrode 15 in an annealing process. In other words, the distance between the source-side and drain-side extension regions 17 becomes shorter in the middle regions of the upper parts of the fin-type semiconductor regions 13a through 13d due to the intensive diffusion in the anneal process than in the remaining part of the fin-type semiconductor regions 13a through 13d, thereby causing degradation in characteristics such as generation of a leakage current.

Note that, in the first example embodiment, the gate electrode 15 has the protruding portions 15a as the impurity blocking portions. The manufacturing process can therefore be simplified as compared to the case where the impurity blocking portions are formed by using a material other than the gate electrode material.

In the first example embodiment, the length of the protruding portions 15a of the gate electrode 15 in the gate width direction is smaller than the length of the fin-type semiconductor regions 13a through 13d in the gate width direction. The protruding portions 15a as the impurity blocking portions can therefore be reliably formed only over the upper surface of the fin-type semiconductor regions 13a through 13d even if misalignment occurs in a lithography process for forming the gate electrode 15 (including the protruding portions 15a).

In the first example embodiment, the fin-type semiconductor regions 13a through 13d are formed on the support substrate 11 with the insulating layer 12 interposed therebetween. However, a semiconductor substrate may alternatively be patterned to form protrusions as fin-type semiconductor regions.

Hereinafter, a manufacturing method of the semiconductor device according to the first example embodiment of the present invention will be described with reference to the figures.

FIGS. 3A through 3D, FIGS. 4A through 4C, and FIGS. 5A and 5B are perspective views sequentially illustrating the manufacturing method of the semiconductor device of the first example embodiment. Note that, in FIGS. 3A through 3D, FIGS. 4A through 4C, and FIGS. 5A and 5B, the same components as those in FIGS. 1A through 1E are denoted by the same reference numerals and characters, and overlapping description will be omitted.

Figure 3A:
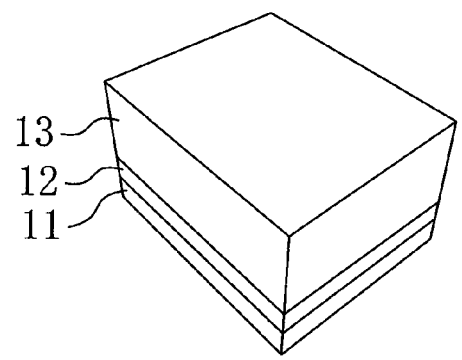
FIGS. 3A, 3B, 3C, and 3D are perspective views sequentially illustrating a manufacturing method of the semiconductor device according to the first example embodiment of the present invention.

First, an SOI (Semiconductor On Insulator) substrate is prepared as shown in FIG. 3A. The SOI substrate has a support substrate 11, an insulating layer 12 formed on the support substrate 11, and a semiconductor layer 13 formed on the insulating layer 12. The support substrate 11 has a thickness of about 775 micrometers and is made of, for example, silicon. The insulating layer 12 has a thickness of about 150 nm and is made of, for example, silicon oxide. The semiconductor layer 13 has a thickness of about 65 nm and is made of, for example, silicon.

Figure 3B:
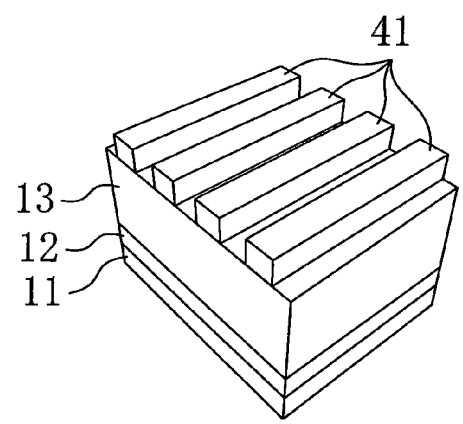
Figure 3C:
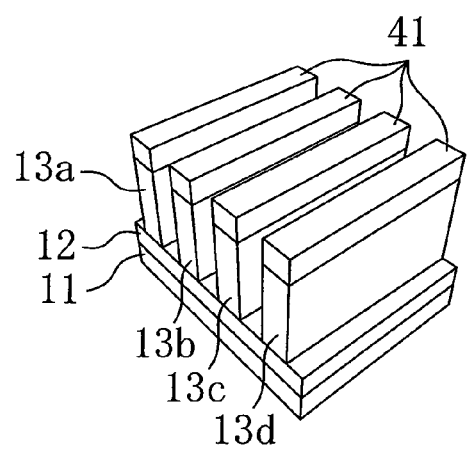
Figure 3D:
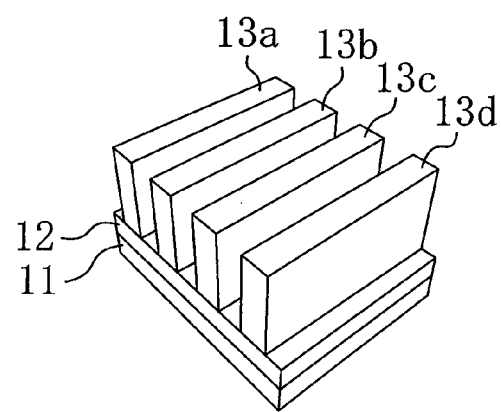

As shown in FIG. 3B, a resist pattern 41 is then formed on the semiconductor layer 13 so as to cover fin-type-semiconductor-region formation regions (regions where fin-type semiconductor regions are to be formed). As shown in FIG. 3C, by using the resist pattern 41 as a mask, the semiconductor layer 13 is patterned to form n-type fin-type semiconductor regions 13a through 13d to be used as active regions. The resist pattern 41 is then removed as shown in FIG. 3D. Each fin-type semiconductor region 13a through 13d has a length "a" of, for example, about 22 nm in the gate width direction, a length "b" of, for example, about 350 nm in the gate length direction, and a height (thickness) "c" of, for example, about 65 nm. The fin-type semiconductor regions 13a through 13d are arranged on the insulating layer 12 at a pitch "d" (e.g., about 30 nm) in the gate width direction.

Figure 4A:
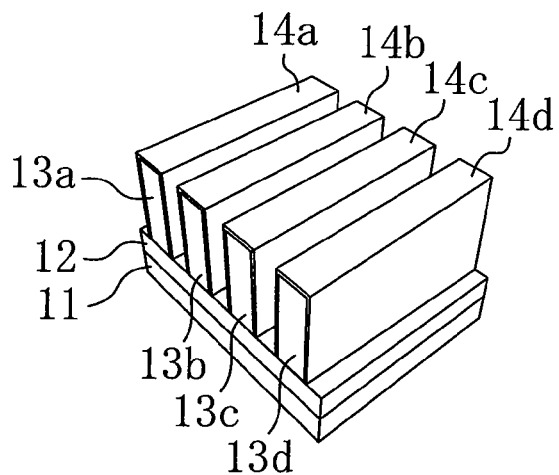
FIGS. 4A, 4B, and 4C are perspective views sequentially illustrating the manufacturing method of the semiconductor device according to the first example embodiment of the present invention.
Figure 4B:
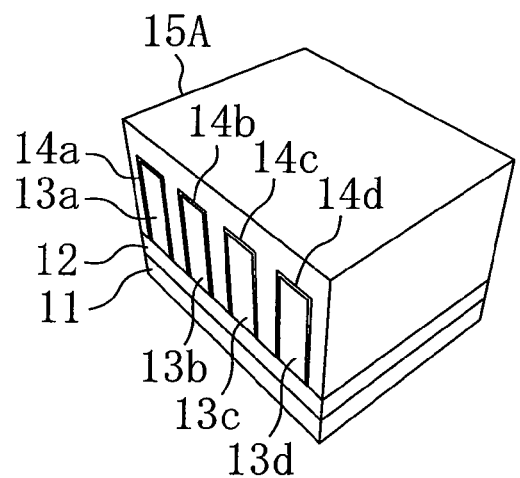

As shown in FIG. 4A, gate insulating films 14a through 14d having a thickness of 3 nm are then formed on the respective surfaces of the fin-type semiconductor regions 13a through 13d. The gate insulating films 14a through 14d are made of, for example, a silicon oxynitride film. As shown in FIG. 4B, a polysilicon film 15A having a thickness of, for example, 60 nm is then formed over the whole surface of the support substrate 11.

Figure 4C:
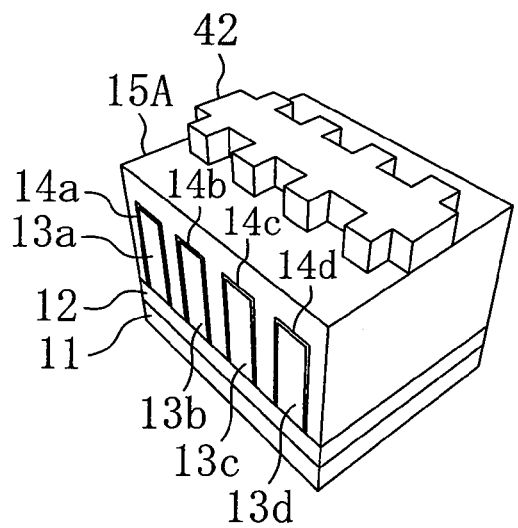

As shown in FIG. 4C, a resist pattern 42 is then formed on the polysilicon film 15A by, for example, double patterning technology so as to cover a gate-electrode formation region and impurity-introduction-blocking-portion formation regions located on both sides (in the gate length direction) of the gate-electrode formation region. The gate-electrode formation region is a region where a gate electrode is to be formed, and the impurity-introduction-blocking-portion formation regions are regions where impurity blocking portions are to be formed (regions where protruding portions are to be formed). The resist pattern 42 has a longer length in the gate length direction in the regions located above the respective upper surfaces of the fin-type semiconductor regions 13a through 13d than in the regions located above the insulating layer 12 (regions located between the fin-type semiconductor regions).

Figure 5A:
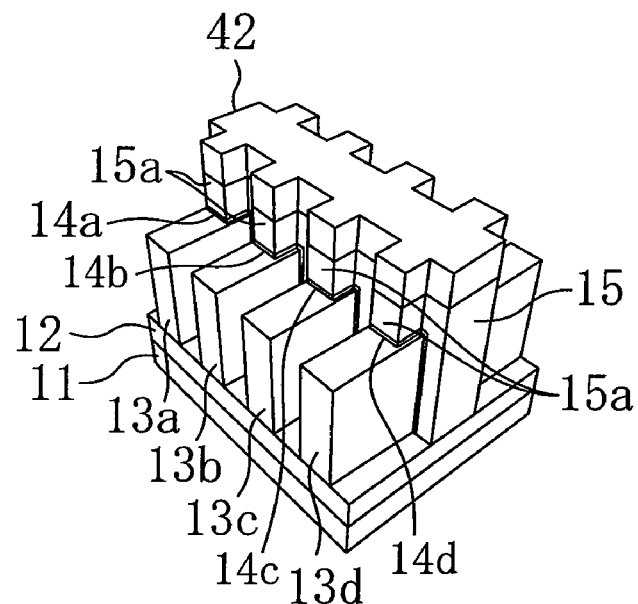
FIGS. 5A and 5B are perspective views sequentially illustrating the manufacturing method of the semiconductor device according to the first example embodiment of the present invention.

As shown in FIG. 5A, by using the resist pattern 42 as a mask, the polysilicon film 15A is then etched to form a gate electrode 15 having protruding portions 15a over the respective upper surfaces of the fin-type semiconductor regions 13a through 13d. In this etching, the gate insulating films 14a through 14d are also etched away in the regions which are not covered by the gate electrode 15 including the protruding portions 15a. Note that the gate electrode 15 (including the protruding portions 15a) has a length of about 48 nm in the gate length direction above the upper surfaces of the fin-type semiconductor regions 13a through 13d. The gate electrode 15 (excluding the protruding portions 15a) has a length of about 38 nm in the gate length direction above the side surfaces of the fin-type semiconductor regions 13a through 13d.

Figure 5B:
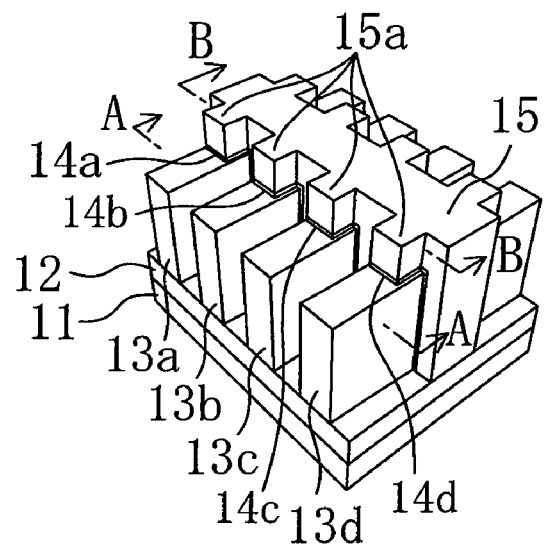

The protruding portions 15a have a length of about 18 nm in the gate width direction, which is smaller than the length "a" (about 22 nm) of the fin-type semiconductor regions 13a through 13d in the gate width direction. The protruding portions 15a have a protruding length of about 5 nm in the gate length direction. The resist pattern 42 is then removed as shown in FIG. 5B.

Although not shown in the figure, by using the gate electrode 15 as a mask, the fin-type semiconductor regions 13a through 13d are then doped with p-type impurities by a plasma doping method at a pressure of 0.6 Pa or less. As a result, p-type extension regions 17 (see FIGS. 1A through 1E) are formed on both sides of the gate electrode 15 in the fin-type semiconductor regions 13a through 13d. In the present example embodiment, by using a pressure of 0.6 Pa or less in the plasma doping method as described above, an implantation dose in the sides of the fin-type semiconductor regions 13a through 13d can be made to be about 80% or more of that in the upper parts of the fin-type semiconductor regions 13a through 13d. For example, the plasma doping method may be performed under the following conditions: source gas: $B_2H_6$ (diborane) diluted with He (helium); $B_2H_6$ concentration in the source gas: 0.5 mass %; total flow rate of the source gas: 100 cm$^3$/min (normal state); pressure in a chamber: 0.35 Pa; source power (plasma generating high-frequency power): 500 W; bias voltage (Vpp): 250 V; substrate temperature: 30° C.; and plasma doping time: 60 seconds. Although not shown in the figure, by using the gate electrode 15 as a mask, impurity ions are then implanted into the fin-type semiconductor regions 13a through 13d to form n-type pocket regions.

Although not shown in the figure, an insulating film having a thickness of, for example, 60 nm is then formed over the whole surface of the support substrate 11. The insulating film is then etched back by anisotropic dry etching to form insulating sidewall spacers 16 (see FIGS. 1A through 1E) on the side surfaces of the gate electrode 15 (including the protruding portions 15a). Although not shown in the figure, by using the gate electrode 15 and the insulating sidewall spacers 16 as a mask, the fin-type semiconductor regions 13a through 13d are then doped with p-type impurities by a plasma doping method at a pressure of, for example, 0.6 Pa or less for about 60 seconds to form p-type source/drain regions 27 (see FIGS. 1A through 1E) in the fin-type semiconductor regions 13a through 13d. The p-type source/drain regions 27 are formed on both sides of the insulating sidewall spacers 16 when viewed from the gate electrode 15. In the present example embodiment, by using a pressure of 0.6 Pa or less in the plasma doping method as described above, an implantation dose in the sides of the fin-type semiconductor regions 13a through 13d can be made to be about 80% or more of that in the upper parts of the fin-type semiconductor regions 13a through 13d.

Note that an annealing process for electrically activating impurities implanted in the fin-type semiconductor regions 13a through 13d to form the extension regions 17 may be performed, for example, after formation of the insulating sidewall spacers 16 and before impurity implantation for forming the source/drain regions 27. This annealing process may alternatively be performed after the impurity implantation for forming the source/drain regions 27. In the former case, another annealing process for electrically activating the implanted impurities is performed after the impurity implantation for forming the source/drain regions 27.

The manufacturing method of the present example embodiment is characterized in that the resist pattern 42 is formed in the step of FIG. 4C so as to cover the gate-electrode formation region and the protruding-portion formation regions located on both sides of the gate-electrode formation region, and the gate electrode 15 having the protruding portions 15a as the impurity blocking portions are thus formed over the upper surfaces of the fin-type semiconductor regions 13a through 13d. In other words, the manufacturing method of the present example embodiment is characterized in that the length of the gate electrode 15 in the gate length direction is larger over the upper surfaces of the fin-type semiconductor regions 13a through 13d than over the side surfaces of the fin-type semiconductor regions 13a through 13d. The distance between the source-side and drain-side extension regions 17 is therefore about the same in the middle regions of the upper parts of the fin-type semiconductor regions 13a through 13d and in the upper corners and both sides of the fin-type semiconductor regions 13a through 13d. Degradation in characteristics such as generation of a leakage current can therefore be prevented even if the fin-type semiconductor regions 13a through 13d have a smaller length in the gate width direction.

Note that it is preferable in the present example embodiment that, in the impurity implantation processes for forming the extension regions 17 and the source/drain regions 27, the implantation dose in the sides of the fin-type semiconductor regions 13a through 13d is 50% or more (more preferably, 80% or more) of that in the upper parts of the fin-type semiconductor regions 13a through 13d. In this case, the specific resistance (or the sheet resistance or the spreading resistance instead of the specific resistance; the same applies to the description below) of the extension regions 17 and the source/drain regions 27 formed in the sides of the fin-type semiconductor regions 13a through 13d can be made at most twice (at most 1.25 times when the above implantation dose is 80% or more) the specific resistance of the extension regions 17 and the source/drain regions 27 formed in the upper parts of the fin-type semiconductor regions 13a through 13d. Accordingly, excellent transistor characteristics can be obtained in fin-type FETs in which the length of the fin-type semiconductor regions 13a through 13d in the gate width direction is smaller than the height of the fin-type semiconductor regions 13a through 13d. In other words, excellent transistor characteristics can be obtained in fin-type FETs whose transistor characteristics are significantly affected by the impurity regions formed in the sides of the fin-type semiconductor regions.

In the present example embodiment, the n-type fin-type semiconductor regions 13a through 13d are doped with p-type impurities by a plasma doping method to form the p-type extension regions 17 and the p-type source/drain regions 27 (i.e., p-type MIS (Metal Insulator Semiconductor) FETs. However, p-type fin-type semiconductor regions may alternatively be doped with n-type impurities to form n-type extension regions and n-type source/drain regions (i.e., n-type MIS-FETs).

It is to be understood that, in the present example embodiment, parameters other than the pressure, such as a gas concentration, source power, or bias power, may be adjusted in order to increase the implantation dose in the plasma doping processes for forming the extension regions 17 and the source/drain regions 27.

In the present example embodiment, $B_2H_6$ diluted with He was used as a source gas of the plasma doping method. However, the source gas is not specifically limited as long as it contains impurities to be implanted to the fin-type semiconductor regions. For example, instead of $B_2H_6$, other kinds of molecules containing boron atoms (e.g., $BF_3$) may be used, or other kinds of molecules formed by boron atoms and hydrogen atoms may be used. Alternatively, AsH$_4$, PH$_3$, or the like may be used. A gas containing impurities may be, but not necessarily, diluted with a rare gas such as He. However, in the case where B$_2$H$_6$ diluted with He is used as a source gas of the plasma doping method as in the present example embodiment, the mass concentration of B$_2$H$_6$ in the source gas is preferably 0.01% to 1%. This is more desirable because this mass concentration facilitates introduction of boron into silicon. More specifically, a sufficient amount of boron is less likely to be introduced at a B$_2$H$_6$ gas concentration of 0.01% or less. At a B$_2$H$_6$ gas concentration of 1% or more, on the other hand, a deposit containing boron is more likely to be formed on the substrate surface.

Mechanism of the Present Invention

Figure 6A:
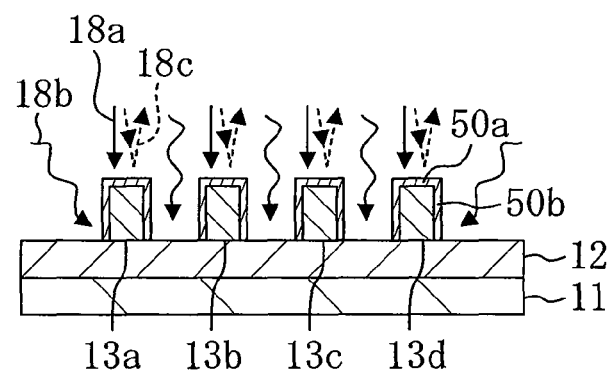
FIGS. 6A and 6B are conceptual diagrams illustrating an impurity implantation process for forming extension regions in the manufacturing method of the semiconductor device according to the first example embodiment of the present invention, where FIG. 6A corresponds to a cross-sectional structure taken along line A-A in FIG. 5B, and FIG. 6B corresponds to a cross-sectional structure taken along line B-B in FIG. 5B.
Figure 6B:
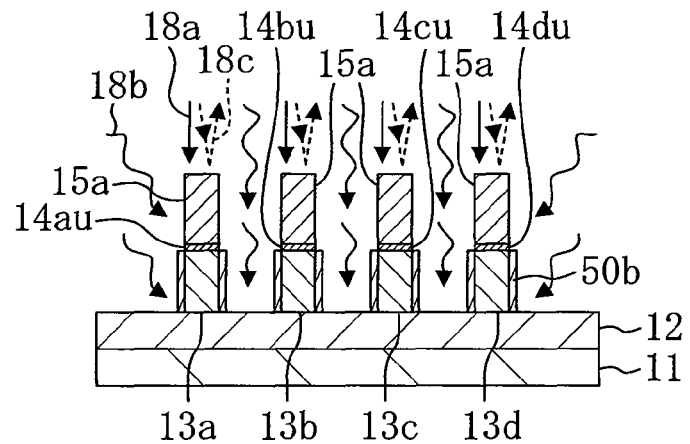

Hereinafter, a mechanism of how the above effects are obtained by the impurity blocking portions of the present invention (the protruding portions 15a of the gate electrode 15 in the first example embodiment) will be described with reference to the figures. FIGS. 6A and 6B are conceptual diagrams illustrating the impurity implantation process for forming the extension regions in the manufacturing method of the present example embodiment. FIG. 6A corresponds to a cross-sectional structure taken along line A-A in FIG. 5B, and FIG. 6B corresponds to a cross-sectional structure taken along line B-B in FIG. 5B.

As shown in FIG. 6A, the upper surfaces and the side surfaces of the fin-type semiconductor regions 13a through 13d are partially covered by the gate electrode 15 (including the protruding portions 15a) and the remaining region of the upper surfaces and the side surfaces of the fin-type semiconductor regions 13a through 13d is exposed at the time the impurity implantation for forming the extension regions is performed (before formation of the insulating sidewall spacers 16). By doping such fin-type semiconductor regions 13a through 13d with p-type impurities by a plasma doping method, impurity regions 50a are formed in the upper parts of the fin-type semiconductor regions 13a through 13d and impurity regions 50b are formed in the sides of the fin-type semiconductor regions 13a through 13d, respectively. The impurity regions 50a have an implantation dose which is determined by the balance of implanted ions 18a, adsorbed species (neutral species such as gas molecules and radicals) 18b, and impurities 18c which are desorbed from the fin-type semiconductor regions 13a through 13d by sputtering (hereinafter, referred to as desorbed impurities 18c). The impurity regions 50b have an implantation dose which is determined mainly by the adsorbed species (neutral species such as gas molecules and radicals) 18b. Note that since some ions are incident obliquely on the side surfaces of the fin-type semiconductor regions 13a through 13d, there are implanted ions 18a and desorbed impurities 18c which affect the implantation dose of the impurity regions 50b. However, since the influence of the implanted ions 18a and the desorbed impurities 18c is much smaller than that of the absorbed species 18b, doping with the adsorbed species 18b is dominant in the side surfaces of the fin-type semiconductor regions 13a through 13d. In other words, the amount of implanted ions 18a which are implanted into the sides of the fin-type semiconductor regions 13a through 13d and the amount of desorbed impurities 18c which are desorbed from the sides of the fin-type semiconductor regions 13a through 13d by sputtering are much smaller than the amount of implanted ions 18a which are implanted into the upper parts of the fin-type semiconductor regions 13a through 13d and the amount of desorbed impurities 18c which are desorbed from the upper parts of the fin-type semiconductor regions 13a through 13d by sputtering.

As described above, the difference in doping between the upper part and the side of each fin-type semiconductor region 13a through 13d is caused by the fact that the implanted ions 18a and the desorbed impurities 18c significantly affect the upper parts of the fin-type semiconductor regions 13a through 13d, while the implanted ions 18a and the desorbed impurities 18c very slightly affect the sides of the fin-type semiconductor regions 13a through 13d. The amount of implanted ions 18a and the implantation energy also affect the amount of desorbed impurities 18c which are desorbed from the fin-type semiconductor regions 13a through 13d by sputtering. A fundamental difference in doping between the upper part and the side of each fin-type semiconductor region 13a through 13d is therefore caused by the significant difference between the amount of implanted ions 18a which is directed to the upper surfaces of the fin-type semiconductor regions 13a through 13d and the amount of implanted ions 18a which is directed to the side surfaces of the fin-type semiconductor regions 13a through 13d. In other words, the difference in doping between the upper part and the side of each fin-type semiconductor region 13a through 13d is caused by the fact that the amount of implanted ions 18a which is directed to the upper surfaces of the fin-type semiconductor regions 13a through 13d is much larger than the amount of implanted ions 18a which is directed to the side surfaces of the fin-type semiconductor regions 13a through 13d.

Accordingly, the above fundamental difference in doping between the upper part and the side of each fin-type semiconductor region 13a through 13d can be almost completely eliminated by directing an extremely small amount of implanted ions 18a to the upper surfaces of the fin-type semiconductor regions 13a through 13d. In other words, when an extremely small amount of implanted ions 18a is directed to the upper surfaces of the fin-type semiconductor regions 13a through 13d, an extremely small amount of implanted ions 18a are implanted to the upper parts of the fin-type semiconductor regions 13a through 13d and an extremely small amount of impurities 18c are desorbed from the upper parts of the fin-type semiconductor regions 13a through 13d. As a result, the influence of the implanted ions 18a on the implantation dose becomes relatively smaller than the influence of the adsorbed species 18b on the implantation dose in the upper parts of the fin-type semiconductor regions 13a through 13d. Doping with the adsorbent species 18b therefore dominantly affects the implantation dose in the upper parts of the fin-type semiconductor regions 13a through 13d. On the other hand, doping with the adsorbed species 18b is originally dominant in the sides of the fin-type semiconductor regions 13a through 13d. In both the upper parts and the sides of the fin-type semiconductor regions 13a through 13d, the implantation dose is therefore determined almost only by the amount of doping with the adsorbed species 18b. The amount of doping with the adsorbed species 18b is determined by adsorption of neutral species (such as gas molecules and radicals) having a random traveling direction that is not affected by electric fields. The amount of doping with the adsorbed species 18b is therefore about the same both in the upper parts and the sides of the fin-type semiconductor regions 13a to 13d. As a result, the same implantation dose can be obtained both in the impurity regions 50a and the impurity regions 50b.

As shown in FIG. 6B, the upper surfaces of the fin-type semiconductor regions 13a through 13d are partially covered by the protruding portions 15a while the side surfaces thereof are exposed at the time when the impurity implantation process for forming the extension regions is performed (before formation of the insulating sidewall spacers 16). When such fin-type semiconductor regions 13a through 13d are doped with p-type impurities by a plasma doping method, impurities are neither implanted nor adsorbed to the upper parts of the fin-type semiconductor regions 13a through 13d. No impurity region is therefore formed in the upper parts of the fin-type semiconductor regions 13a through 13d. On the other hand, impurity regions 50b (corresponding to the second impurity regions 50b in FIG. 6A) are formed in the sides of the fin-type semiconductor regions 13a through 13d. The implantation dose of the impurity regions 50b is determined mainly by the adsorbed species (neutral species such as gas molecules and radicals) 18b.

Figure 7:
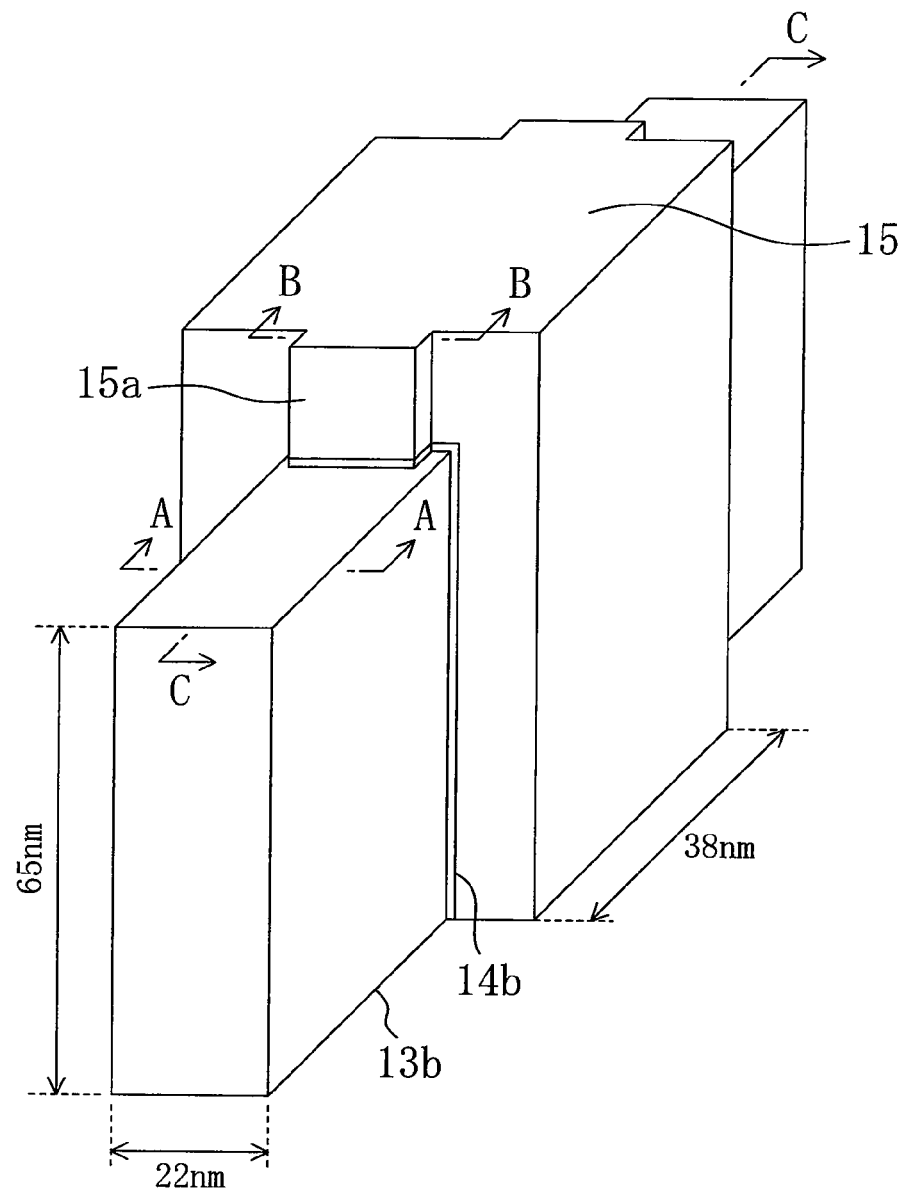
FIG. 7 is a perspective view showing only one fin-type semiconductor region in the structure of FIG. 5B, and a gate insulating film and a gate electrode which are formed over the fin-type semiconductor region.
Figure 8A:
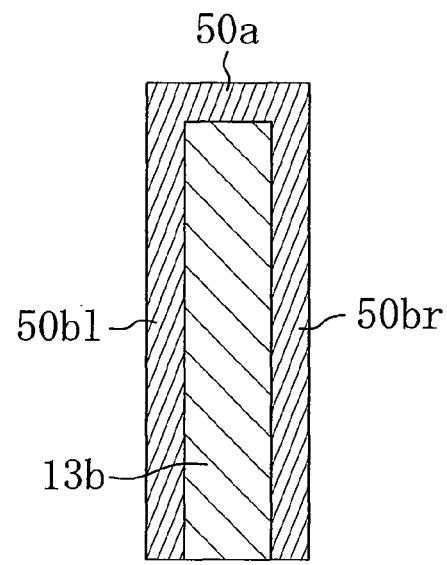
FIG. 8A is a diagram showing impurity distribution before an annealing process in a cross-sectional structure taken alone line A-A in FIG. 7.
Figure 8B:
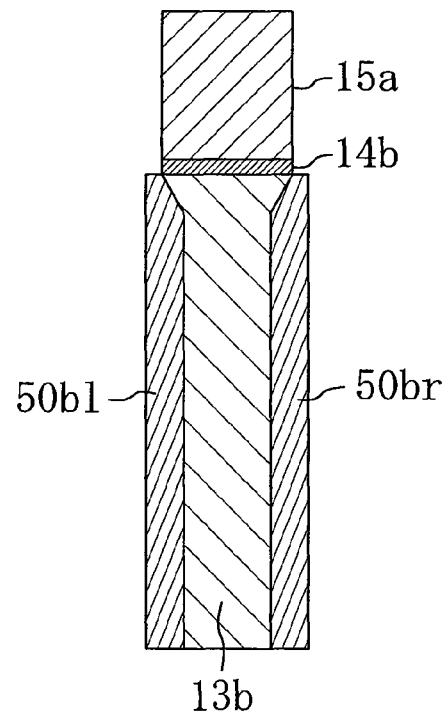
FIG. 8B is a diagram showing impurity distribution before the annealing process in a cross-sectional structure taken alone line B-B in FIG. 7.
Figure 8C:
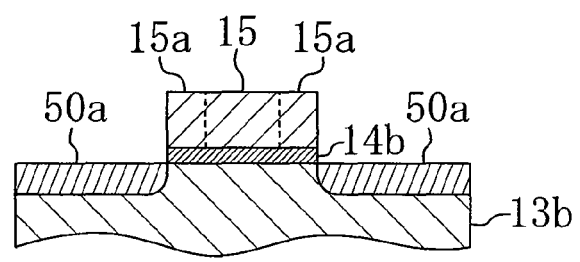
FIG. 8C is a diagram showing impurity distribution before the annealing process in a cross-sectional structure taken alone line C-C in FIG. 7.
Figure 9A:
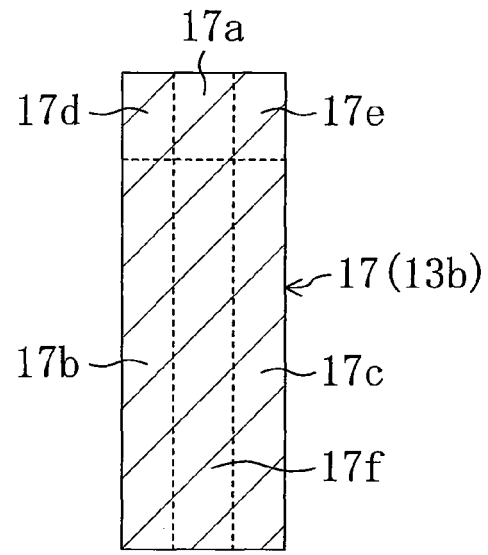
FIG. 9A is a diagram showing impurity distribution after the annealing process in the cross-sectional structure taken alone line A-A in FIG. 7.
Figure 9B:
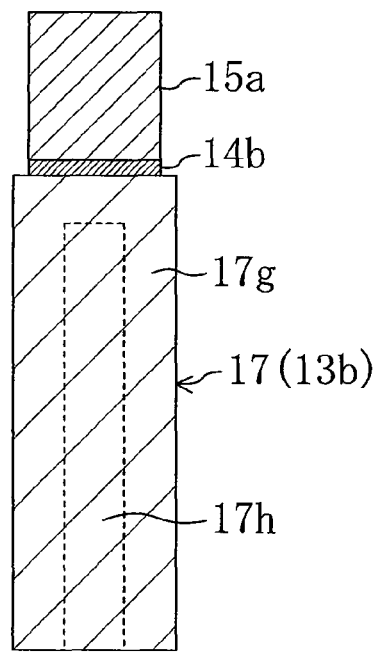
FIG. 9B is a diagram showing impurity distribution after the annealing process in the cross-sectional structure taken alone line B-B in FIG. 7.
Figure 9C:
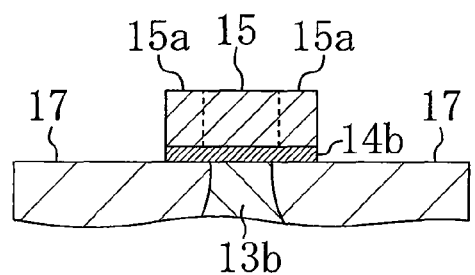
FIG. 9C is a diagram showing impurity distribution after the annealing process in the cross-sectional structure taken alone line C-C in FIG. 7.

Hereinafter, how impurities implanted to the fin-type semiconductor regions 13a through 13d to form the extension regions 17 diffuse in an annealing process will be described based on the impurity distribution before and after the annealing process. Description is herein given to the fin-type semiconductor region 13b in the structure of FIG. 5B. FIG. 7 is a perspective view showing only the fin-type semiconductor region 13b in the structure of FIG. 5B, and the gate insulating film 14b and the gate electrode 15 which are formed over the fin-type semiconductor region 13b. FIG. 8A shows an impurity distribution before the annealing process in a cross-sectional structure taken along line A-A in FIG. 7. FIG. 8B shows an impurity distribution before the annealing process in a cross-sectional structure taken along line B-B in FIG. 7. FIG. 8C shows an impurity distribution before the annealing process in a cross-sectional structure taken along line C-C in FIG. 7. FIG. 9A shows an impurity distribution after the annealing process in the cross-sectional structure taken along line A-A in FIG. 7. FIG. 9B shows an impurity distribution after the annealing process in the cross-sectional structure taken along line B-B in FIG. 7. FIG. 9C shows an impurity distribution after the annealing process in the cross-sectional structure taken along line C-C in FIG. 7.

First, description will be given to impurity distribution before and after the annealing process in the cross-sectional structure taken along line A-A in FIG. 7. As shown in FIG. 8A, in the cross-sectional structure taken along line A-A in FIG. 7 (the cross-sectional structure of the fin-type semiconductor region 13b which is not covered by the gate electrode 15 (including the protruding portions 15a)), an impurity region 50a is formed in the upper part, and an impurity region 50bl is formed in the left side, and an impurity region 50br is formed in the right side. It is herein assumed that the impurity regions 50a, 50bl, and 50br have approximately the same implantation dose. When this fin-type semiconductor region 13b is subjected to the annealing process, impurities in the impurity regions 50a, 50bl, and 50br in FIG. 8A diffuse in a wider range to form an extension region 17 as shown in FIG. 9A. A portion 17a in FIG. 9A located in the middle region of the upper part of the fin-type semiconductor region 13b was originally the impurity region 50a. Although the portion 17a already had a high impurity concentration before the annealing process, impurities in the impurity region 50bl and the impurity region 50br of the fin-type semiconductor region 13b further diffuse into the portion 17a by the annealing, thereby causing concentration of impurities in the portion 17a. In annealing processes, impurities generally diffuse from a highly doped region to a lightly doped region. Since the portion 17a located in the middle region of the upper part of the fin-type semiconductor region 13b was originally the impurity region 50a, the portion 17a has the highest impurity concentration in the cross-sectional structure of FIG. 9A. The largest amount of impurities therefore attempt to diffuse from the portion 17a to the fin-type semiconductor region 13b under the gate electrode 15 where the impurity concentration is the lowest. In other words, the portion which was originally the impurity region 50a supplies the largest amount of impurities as a diffusion source into a region under the gate electrode 15. Note that, as shown in FIG. 9A, other impurity regions are formed in addition to the potion 17a. More specifically, an impurity region is formed in a left side 17b of the fin-type semiconductor region 13b by the impurities diffused from the impurity region 50bl in FIG. 8A. An impurity region is formed in a right side 17c of the fin-type semiconductor region 13b by the impurities diffused from the impurity region 50br of FIG. 8A. An impurity region is formed in a middle part 17f of the fin-type semiconductor region 13b by the impurities diffused from the impurity regions 50bl and 50br of FIG. 8A. An impurity region is formed in an upper left corner 17d of the fin-type semiconductor region 13b by the impurities diffused from the impurity regions 50a and 50bl of FIG. 8A. An impurity region is formed in an upper right corner 17e of the fin-type semiconductor region 13b by the impurities diffused from the impurity regions 50a and 50br of FIG. 8A. However, each of the above impurity regions has a lower impurity concentration than that of the middle region of the upper part of the fin-type impurity region 13b (i.e., the portion 17a).

Figure 10:
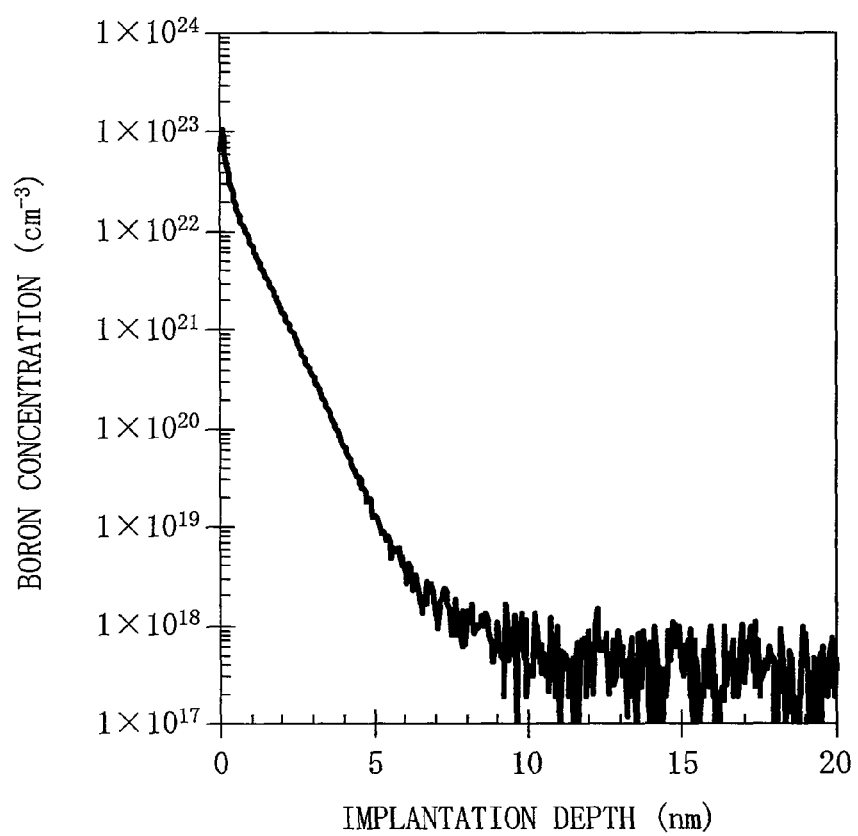
FIG. 10 shows an SIMS measurement result of the relation between the implantation depth and the boron concentration when boron was implanted to a semiconductor region (silicon region) by a plasma doping method.

FIG. 10 shows an SIMS measurement result of the relation between the implantation depth and the boron concentration when boron was implanted to a semiconductor region (silicon region) by a plasma doping method. As shown in FIG. 10, the impurity concentration is the highest at the topmost surface of the semiconductor region and decreases toward the inside of the semiconductor region. Accordingly, the impurity region 50a of FIG. 8A has a highest impurity concentration at the topmost surface (upper surface) of the fin-type semiconductor region 13b before the annealing process. As described before, impurities in the impurity regions 50bl and 50br in the left and right sides of the fin-type semiconductor region 13b also diffuse into the topmost surface of the fin-type semiconductor region 13b in the impurity region 50a, thereby causing concentration of impurities at the topmost surface of the impurity region 50a. As a result, the topmost surface of the impurity region 50a in FIG. 8A is likely to be a diffusion source of impurities which diffuse into the fin-type semiconductor region 13b under the gate electrode 15.

In the present example embodiment, however, as shown in FIG. 7, the protruding portions 15a are formed on both sides of the gate electrode 15 over the upper surface of the fin-type semiconductor region 13b. In other words, the gate electrode 15 (including the protruding portions 15a) formed over the upper surface of the fin-type semiconductor region 13b has a longer length in the gate length direction than that of the gate electrode 15 formed over the side surfaces of the fin-type semiconductor region 13b. Therefore, in the upper surface of the fin-type semiconductor region 13b, the region that is not covered by the gate electrode 15 as shown in FIG. 8A (i.e., an impurity introducing region) can be separated from the gate electrode 15 excluding the protruding portions 15a (the gate electrode 15 formed over the side surface of the fin-type semiconductor region 13b). In this way, in the present example embodiment, it is anticipated that the topmost surface of the impurity region 50a in FIG. 8A is likely to be a diffusion source of impurities into the region under the gate electrode 15, whereby the impurity introducing region is separated from the gate electrode 15 (excluding the protruding portions 15a) by the excessive diffusion length of impurities. More specifically, in the first example embodiment, the protruding portions 15a on both sides of the gate electrode 15 have a protruding length of about 5 nm in the gate length direction. In other words, the gate electrode 15 (including the protruding portions 15a) formed over the upper surface of the fin-type semiconductor region 13b is longer in the gate length direction by about 10 nm (5 nm×2) than the gate electrode 15 formed on the side surfaces of the fin-type semiconductor region 13b. In the annealing process, impurities may diffuse from the impurity regions 50bl and 50br in the left and right sides of the fin-type semiconductor region 13b into the portion that was originally the impurity region 50a (see FIG. 8A) located in the middle region of the upper part of the fin-type semiconductor region 13b, thereby causing concentration of the impurities in this portion. In the structure of the present example embodiment, however, the impurity introducing region is separated in advance from the gate electrode 15 (excluding the protruding portions 15a) by about 5 nm. Accordingly, even if such concentration of the impurities happens in the above portion and the diffusion length of the impurities into a region under the gate electrode 15 is increased by about 5 nm than in the case where no such concentration of impurities occurs, the distance between the source-side and drain-side extension regions 17 in the middle region of the upper part of the fin-type semiconductor region 13b becomes the same as the distance between the source-side and drain-side extension regions 17 in both sides of the fin-type semiconductor region 13b where neither diffusion nor concentration of impurities occurs from the left and right sides of the fin-type semiconductor region 13b.

Hereinafter, description will be given to impurity distribution before and after the annealing process in the cross-sectional structure taken along line B-B in FIG. 7. As shown in FIG. 8B, in the cross-sectional structure taken along line B-B in FIG. 7 (the cross-sectional structure of the fin-type semiconductor region 13b having the protruding portion 15a of the gate electrode 15), no impurity region is formed in the upper part, while impurity regions 50bl and 50br are formed in the left and right sides, respectively. It is herein assumed that the impurity regions 50bl and 50br have approximately the same implantation dose as that of the impurity region 50a in FIG. 8A. When this fin-type semiconductor region 13b is subjected to the annealing process, impurities in the impurity regions 50bl and 50br in FIG. 8B diffuse in a wider range to form an extension region 17 as shown in FIG. 9A. Although not shown in the figure, impurities in the impurity region 50a (see FIG. 8A) located in the upper part of the fin-type semiconductor region 13b adjacent to the protruding portion 15a also diffuse into a region under the protruding portion 15a. As a result, the impurity concentration in the extension region 17 formed in the upper part of the fin-type semiconductor region 13b becomes approximately the same as that of the extension region 17 formed in the side of the fin-type semiconductor region 13b.

Note that, in the annealing process, impurities in the impurity regions 50bl, 50br shown in FIG. 8B intensively diffuse to a middle part 17h of the fin-type semiconductor region 13b. However, the middle part 17h of the fin-type semiconductor region 13b is a portion located inside the semiconductor (silicon) substrate, and has an extremely low impurity concentration before the annealing process. Accordingly, the above-mentioned phenomenon of the annealing process, in which impurities intensively diffuse into a region which has been already highly doped before the annealing process, does not occur in the middle part 17h of the fin-type semiconductor region 13b. A depth profile of the impurity concentration cannot be measured by SMIS in an uneven semiconductor region such as a side of a fin-type semiconductor region. As described above, however, doping with adsorbed species is dominant in the impurity implantation to the side of the fin-type semiconductor region, as compared to the impurity implantation to the upper part of the fin-type semiconductor region. It can therefore be assumed that, for example, as in the case of the depth profile of the impurity concentration in FIG. 10 (the depth profile of the impurity concentration in a flat semiconductor region), the impurity concentration in the side of the fin-type semiconductor region is also higher at the surface than in the inside. For example, in the first example embodiment, the fin-type semiconductor region 13b has a width (length in the gate width direction) of 22 nm. Therefore, the middle of the fin-type semiconductor region 13b is located at a depth of 11 nm from the semiconductor (silicon) surface. Referring to FIG. 10, the impurity concentration is about $1 \times cm^{-3}$ at the topmost surface (implantation depth: 0 nm), while the impurity concentration decreases to about $1 \times cm^{-3}$ or less at a depth of 11 nm from the topmost surface, which is at least four digits smaller than the impurity concentration at the topmost surface of the semiconductor region.

Accordingly, impurities intensively diffuse into the middle part 17h of the fin-type-semiconductor region 13b of FIG. 9B in the anneal process. Before the annealing process, however, the impurity concentration in the middle part 17h of the fin-type semiconductor region 13b was at least four digits smaller than that at the topmost surface of the impurity regions 50bl, 50br on both sides (see FIG. 8B). Therefore, even if impurities intensively diffuse into the middle part 17 of the fin-type semiconductor region 13b, the middle part 17 does not become a portion having the highest impurity concentration after the annealing process. In other words, the middle part 17h of the fin-type semiconductor region 13b has a lower impurity concentration than that of the upper part and both sides (collectively, a portion 17g) of the fin-type semiconductor region 13b.

In the fin-type semiconductor region 13b of FIG. 9B, it is the topmost surface portions of the impurity regions 50bl, 50br which have the highest impurity concentration and which therefore serve as a diffusion source of impurities which diffuse into a region under the gate electrode 15 (excluding the protruding portions 15a). As can be seen from FIG. 9B, however, the above-mentioned phenomenon, in which impurities are more concentrated than before the annealing process due to the impurity diffusion in the annealing process, does not occur in the regions which were originally the topmost surfaces of the impurity regions 50bl, 50br before the annealing process. Therefore, impurities do not excessively diffuse from the topmost surface portions of the impurity regions 50bl, 50br into a region under the gate electrode 15 (excluding the protruding portions 15a).

As has been described above, in the cross-sectional structure taken along line A-A in FIG. 7 (the cross-sectional structure of the fin-type semiconductor region 13b which is not covered by the gate electrode 15 (including the protruding portion 15a), the impurity concentration is the highest near the topmost surface in the middle region of the upper part of the fin-type semiconductor region 13b at the time the implantation process is performed. In addition, impurities are likely to be concentrated in the topmost surface of the middle region of the upper part of the fin-type semiconductor region 13b in the annealing process. The topmost surface of the middle region of the upper part of the fin-type semiconductor region 13b therefore serves as a diffusion source which supplies a large amount of impurities into a region under the gate electrode 15. The impurities diffusing from the middle region of the upper part of the fin-type semiconductor region 13b to the region under the gate electrode 15 thus has an increased diffusion length.

The cross-sectional structure taken along line B-B in FIG. 7 (the cross-sectional structure of the fin-type semiconductor region 13b having the protruding portion 15a of the gate electrode 15), on the other hand, does not have such a diffusion source (a diffusion source that causes concentration of impurities in the annealing process) as that in the cross-sectional structure taken along line A-A in FIG. 7. In the cross-sectional structure taken along line B-B in FIG. 7, the topmost surfaces of the sides of the fin-type semiconductor region 13b therefore have the largest diffusion length of impurities into a region under the gate electrode 15. However, the diffusion length of the impurities diffusing from the sides of the fin-type semiconductor region 13b into the region under the gate electrode 15 is shorter than that of the impurities diffusing from the middle region of the upper part of the fin-type semiconductor region 13b into the region under the gate electrode 15 in the cross-sectional structure taken along line A-A in FIG. 7.

In the cross-sectional structure taken along line A-A in FIG. 7, a portion of the fin-type semiconductor region 13b which is not covered by the gate electrode 15, that is, a portion of the fin-type semiconductor region 13b which is to be doped with impurities in an implantation process, is formed away from the gate electrode 15 by the protruding portion 15a of the present invention in the middle region of the upper part of the fin-type semiconductor region 13b. No such protruding portion 15a is formed in the sides of the fin-type semiconductor region 13b. Accordingly, the distance between the source-side and drain-side extension regions becomes about the same in the middle region of the upper part of the fin-type semiconductor region 13b and the sides of the fin-type semiconductor region 13b.

Finally, description will be given to impurity distribution before and after the annealing process in the cross-sectional structure taken along line C-C in FIG. 7. As shown in FIG. 8C, in the cross-sectional structure taken along line C-C in FIG. 7 (the cross-sectional structure in the gate length direction), the impurity region 50a (corresponding to the impurity region 50a in FIG. 8A) is formed on both sides of the gate electrode 15 in the upper part of the fin-type semiconductor region 13b. The impurity regions 50a are formed away from the gate electrode 15 by the protruding portions 15a of the present invention. When such a fin-type semiconductor region 13b is subjected to the annealing process, impurities in the impurity regions 50a shown in FIG. 8C diffuse in a wide range to form extension regions 17 as shown in FIG. 9C. Although not shown in the figure, in this annealing process, impurities in the impurity regions 50bl, 50br (see FIGS. 8A and 8C) on both side of the fin-type semiconductor region 13b also diffuse into the middle of the fin-type semiconductor region 13b. As a result, the extension regions 17 are formed entirely in the height direction of the fin-type semiconductor region 13b. Moreover, since the impurity regions 50a are formed away from the gate electrode 15 by the protruding portions 15a of the present invention. The impurities in the impurity regions 50a can thus be prevented from diffusing into the region under the gate electrode 15 (excluding the protruding portions 15a) in the annealing process. In other words, the distance between the source-side and drain-side extension regions 17 can be prevented from being reduced. Degradation in characteristics such as generation of a leakage current can be prevented even if the fin-type semiconductor region 13b has a reduced length in the gate width direction.

Second Example Embodiment

Hereinafter, a semiconductor device and a manufacturing method thereof according to a second example embodiment of the present invention will be described with reference to the figures.

Figure 11A:
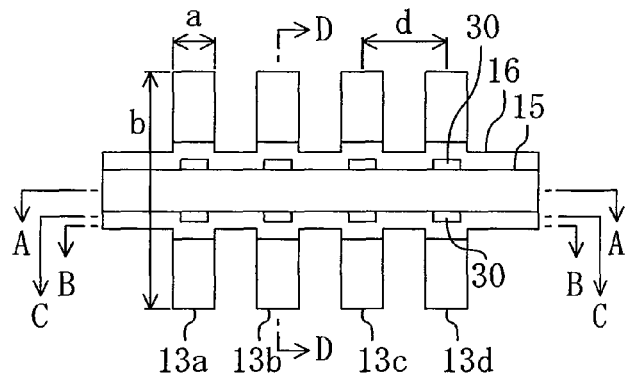
FIGS. 11A, 11B, 11C, 11D, and 11E are diagrams showing a structure of a semiconductor device according to a second example embodiment of the present invention, where
Figure 11B:
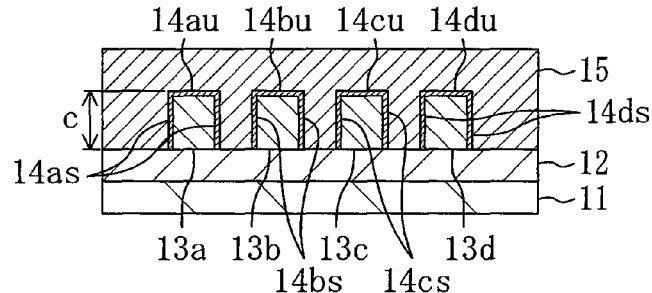
Figure 11C:
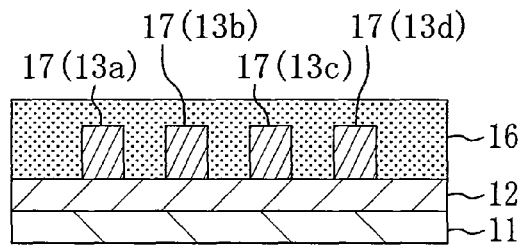
Figure 11D:
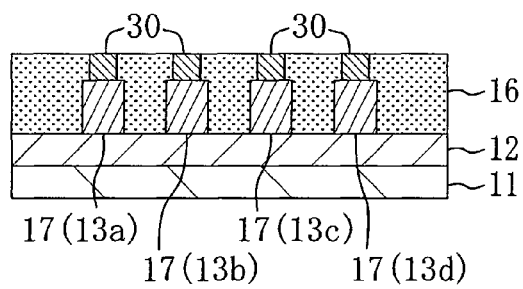
Figure 11E:
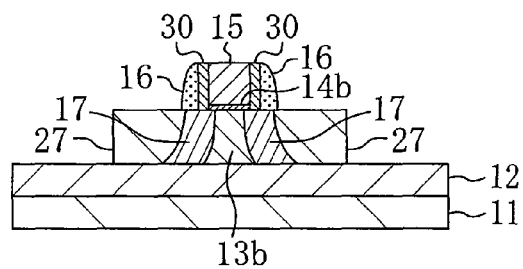
Figure 12:
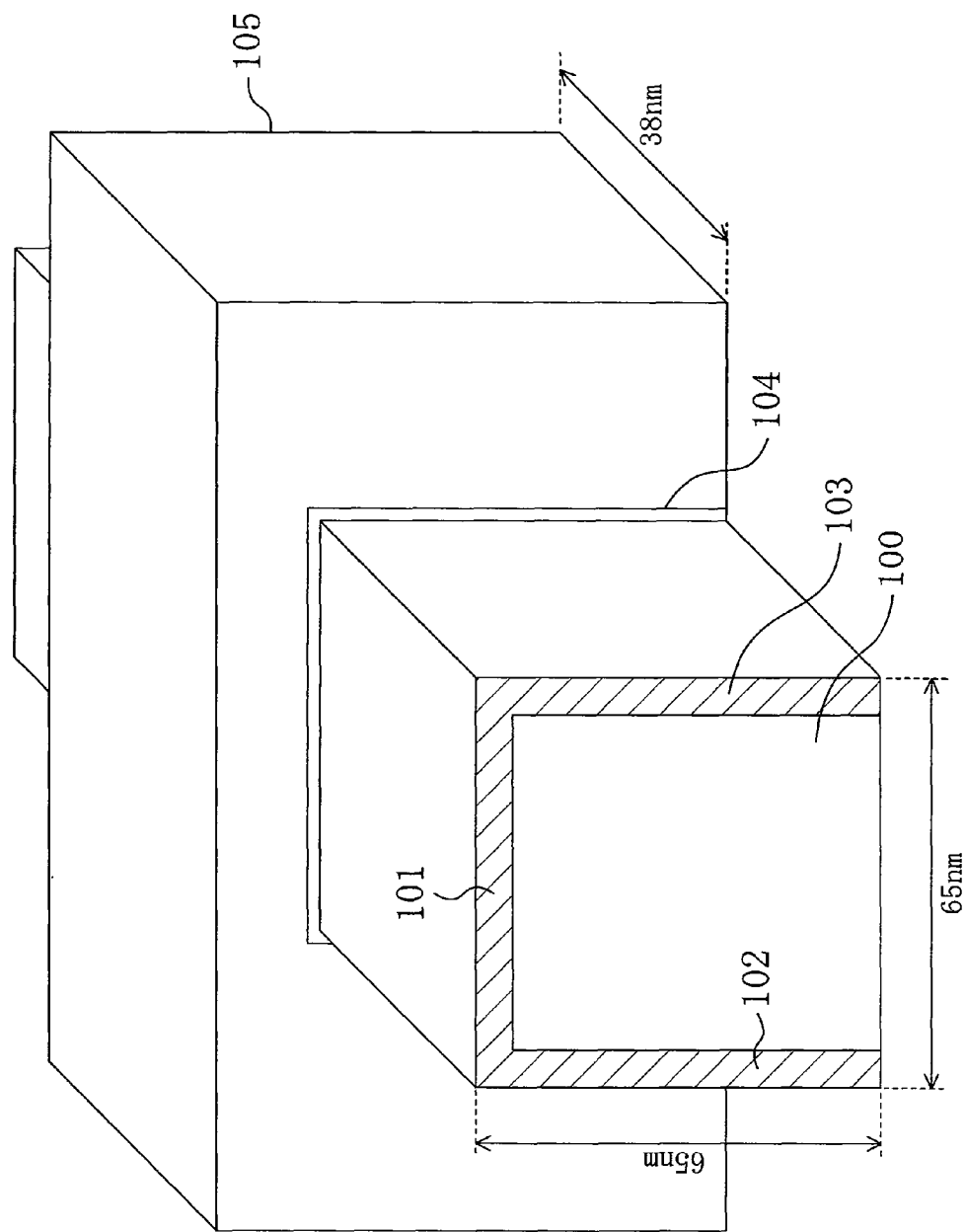
FIG. 12 is a schematic perspective view showing the shapes of impurity regions right after a doping process for forming extension regions was performed in a manufacturing process of a fin-type FET in which a fin-type semiconductor region has a relatively large length in the gate width direction.
Figure 13:
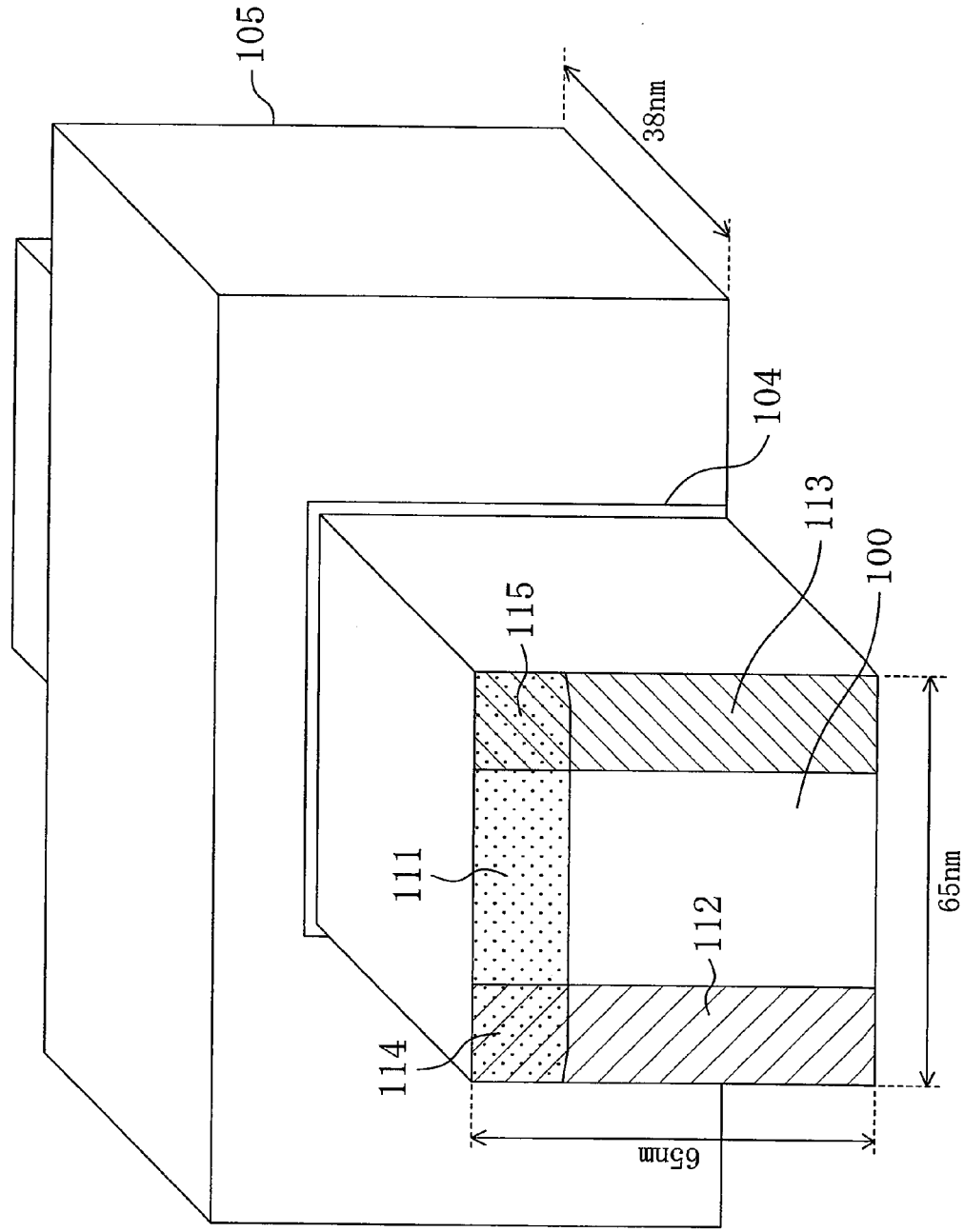
FIG. 13 is a schematic perspective view showing the shapes of the impurity regions after the fin-type FET of FIG. 12 was annealed.
Figure 14:
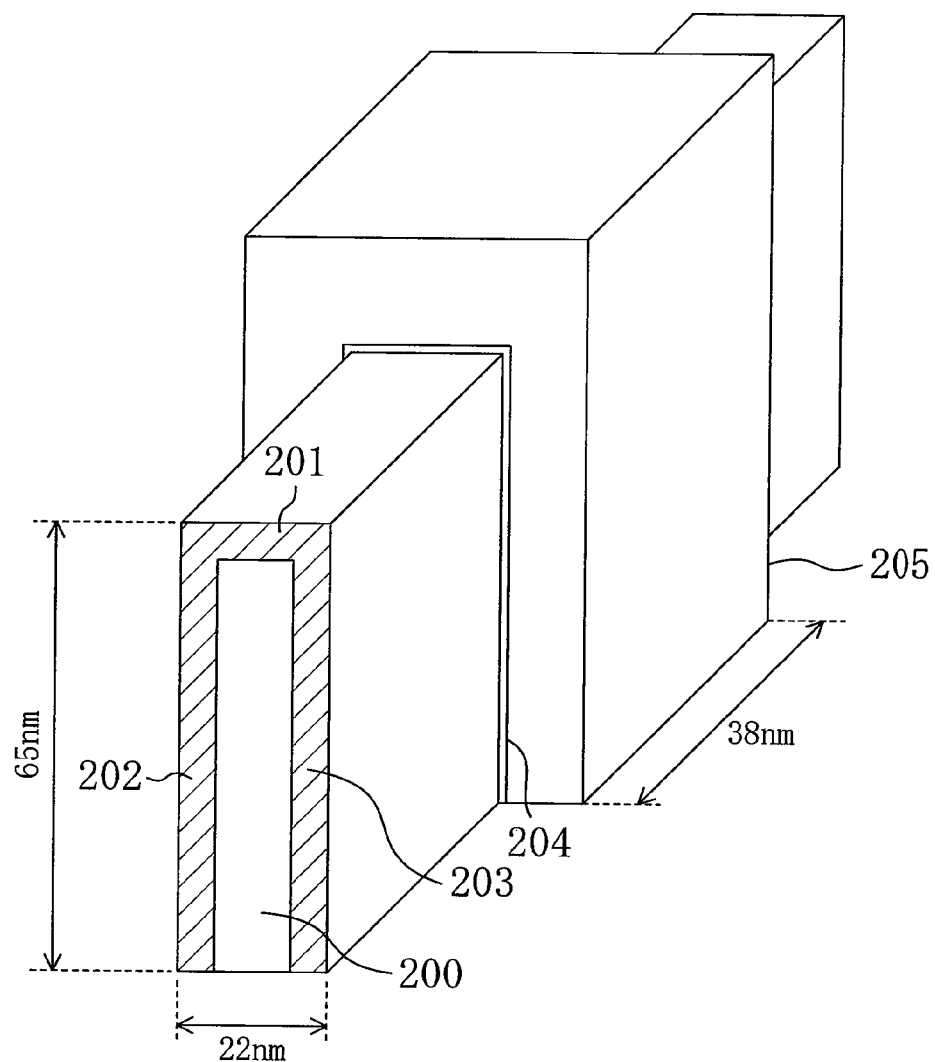
FIG. 14 is a schematic perspective view showing the shapes of impurity regions right after a doping process for forming extension regions was performed in a manufacturing process of a fin-type FET in which a fin-type semiconductor region has a small length in the gate width region.
Figure 15:
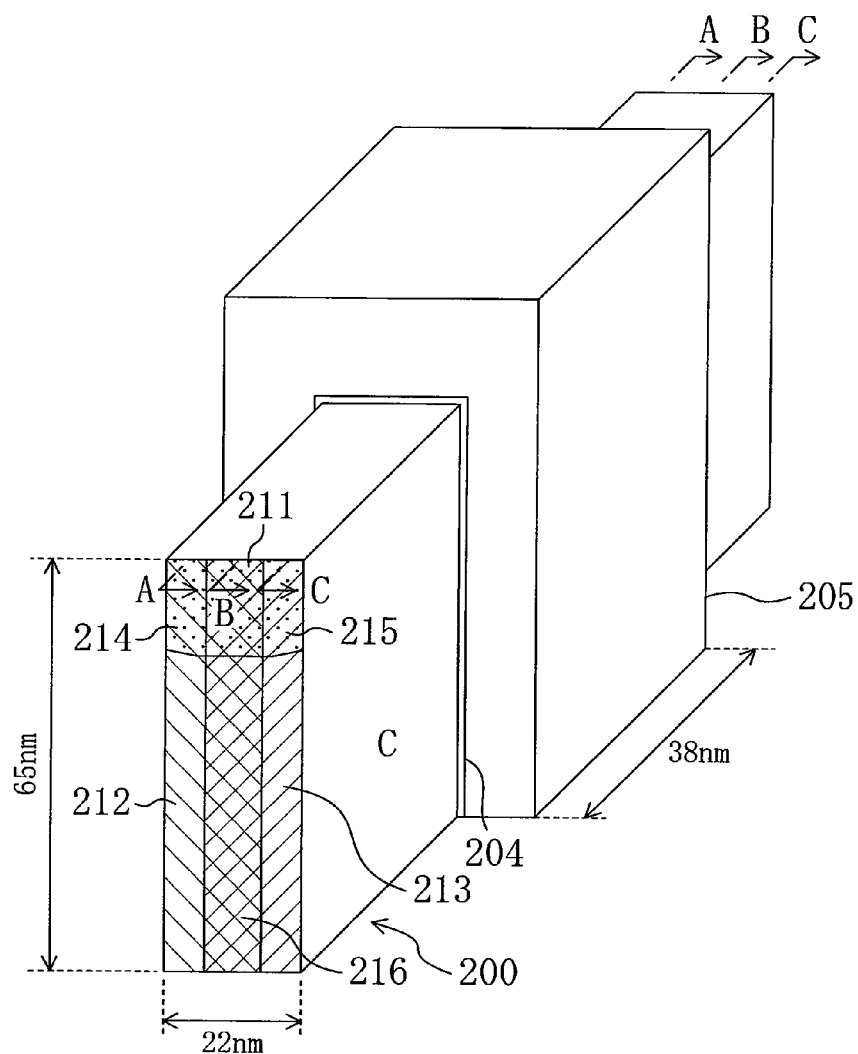
FIG. 15 is a schematic perspective view showing the shapes of impurity regions after the fin-type FET of FIG. 14 was annealed.
Figure 16A:
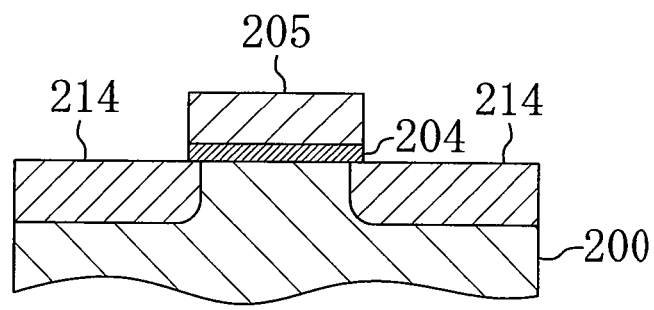
FIGS. 16A, 16B, and 16C are diagrams illustrating a mechanism of generating a leakage current in a fin-type FET, where FIG. 16A corresponds to a cross-sectional view taken along line A-A in FIG. 15, FIG. 16B corresponds to a cross-sectional view taken along line B-B in FIG. 15, and FIG. 16C corresponds to a cross-sectional view taken along line C-C in FIG. 15.
Figure 16B:
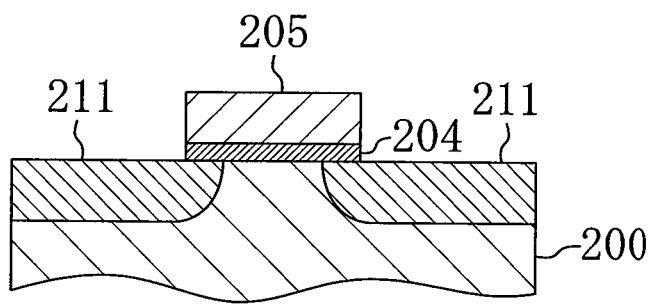
Figure 16C:
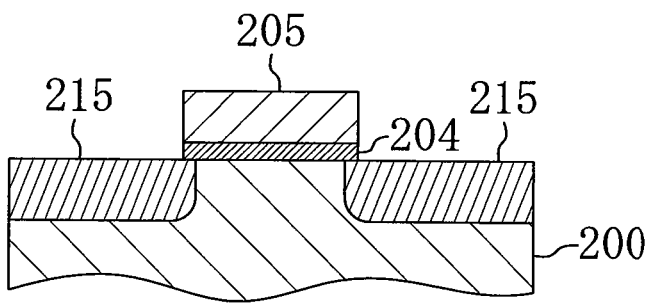

FIGS. 11A through 11E are diagrams showing a structure of a semiconductor device according to the second example embodiment of the present invention, and more specifically, a semiconductor device having fin-type FETs. FIG. 11A is a plan view, FIG. 11B is a cross-sectional view taken along line A-A in FIG. 11A, FIG. 11C is a cross-sectional view taken along line B-B in FIG. 11A, FIG. 11D is a cross-sectional view taken along line C-C in FIG. 11A, and FIG. 11E is a cross-sectional view taken along line D-D in FIG. 11A. Note that the same components as those of the first example embodiment of FIGS. 1A through 1E are denoted with the same reference numerals and characters, and overlapping description will be omitted.

The fin-type FET of the second example embodiment is different from that of the first example embodiment in that, as shown in FIGS. 11A through 11E, the protruding portions 15a of the gate electrode 15 of the first example embodiment are replaced with impurity blocking portions 30 made of a material other than the gate electrode material, such as an insulating material. In other words, the gate electrode 15 of the present example embodiment has a uniform gate length in the gate width direction. Note that no impurity blocking portion 30 is formed between the fin-type semiconductor regions 13a through 13d. The impurity blocking portions 30 have a length of about 18 nm in the gate width direction, which is smaller than the length "a" (about 22 nm) of the fin-type semiconductor regions 13a through 13d in the gate width direction. The gate electrode 15 has a gate length of about 38 nm, while the impurity blocking portions 30 have a protruding length of about 5 nm in the gate length direction. The impurity blocking portions 30 have a thickness of about 60 nm which is the same as the thickness of the gate electrode 15.

Note that no gate insulating film 14au through 14du is formed under the impurity blocking portions 30 on the upper surfaces of the fin-type semiconductor regions 13a through 13d. The insulating sidewall spacers 16 are formed also on the side surfaces of the impurity blocking portions 30.

In the example embodiment described above, the impurity blocking portions 30 are formed on both sides of the gate electrode 15 on the upper surfaces of the fin-type semiconductor regions 13a through 13d. Impurity regions formed in the middle regions of the upper parts of the fin-type semiconductor regions 13a through 13d in the doping process can thus be separated from the gate electrode 15. As a result, impurities in the impurity regions can be prevented from diffusing into a region under the gate electrode during annealing. In other words, the distance between source-side and drain-side extension regions 17 can be prevented from being reduced in the middle regions of the upper parts of the fin-type semiconductor regions 13a through 13d due to the intensive diffusion to the middle regions of the upper parts of the fin-type semiconductor regions 13a through 13d in the annealing process. Accordingly, the distance between the source-side and drain-side extension regions 17 becomes the same in the middle regions of the upper parts of the fin-type semiconductor regions 13a through 13d and in the upper corners and both sides of the fin-type semiconductor regions 13a through 13d. As a result, degradation in characteristics such as generation of a leakage current can be prevented even when the fin-type semiconductor regions 13a through 13d have a reduced length in the gate width direction.

In the present example embodiment, the gate length of the gate electrode 15 is set to 45 nm or less, and the fin-type semiconductor regions 13a through 13d have a height larger than their length in the gate width direction. The above effect of preventing degradation in characteristics becomes significant especially in the case where a three-dimensional device such as a fin-type FET is reduced in dimensions by using such a gate electrode 15 and such fin-type semiconductor regions 13a through 13d.

In the present example embodiment, the step of depositing a material of the impurity blocking portions 30 and the step of patterning this material are added as compared to the first example embodiment. In this case, however, degradation in characteristics caused by providing the protruding portions 15a of the gate electrode 15 as in the first example embodiment can be prevented.

In the present example embodiment, the impurity blocking portion 30 may be removed after forming the impurity region (the extension regions 17 and the source/drain regions 27).

The disclosure of Japanese Patent Application No. -09 filed May 29, including specification, drawings, and claims is incorporated herein by reference in its entirety.

INDUSTRIAL APPLICABILITY

The present invention generally relates to semiconductor devices, and is especially useful for obtaining desired characteristics in a semiconductor device of a three-dimensional structure having a fin-shaped semiconductor region on a substrate.

DESCRIPTION OF REFERENCE CHARACTERS

11 support substrate
12 insulating layer
13a through 13d fin-type semiconductor region
14a through 14d gate insulating film
15 gate electrode
15a protruding portion
15A polysilicon film
16 insulating sidewall spacer
17 extension region
17a portion having a high impurity concentration of the extension region (in the middle region of the upper part of the fin-type semiconductor region)
17b another portion of the extension region (left side of the fin-type semiconductor region)
17c another portion of the extension region (right side of the fin-type semiconductor region)
17d another portion of the extension region (upper left corner of the fin-type semiconductor region)
17e another portion of the extension region (upper right corner of the fin-type semiconductor region)
17f another portion of the extension region (middle part of the fin-type semiconductor region)
17g portion having a high impurity concentration of the extension region (upper part and both sides of the fin-type semiconductor region)
17h another portion of the extension region (middle part of the fin-type semiconductor region)
18a implanted ions
18b adsorbed species
18c desorbed impurities
27 source/drain region
30 impurity blocking portion
41, 42 resist pattern
50a, 50b impurity region

The invention claimed is:

1. A semiconductor device, comprising:
a fin-type semiconductor region formed on a substrate;
a gate insulating film formed so as to cover an upper surface and both side surfaces of a predetermined portion of the fin-type semiconductor region;
a gate electrode formed on the gate insulating film;
an impurity region formed on both sides of the gate electrode in the fin-type semiconductor region; and
an impurity blocking portion for blocking the introduction of impurities, the impurity blocking portion being provided adjacent both sides of the gate electrode over an upper surface of the fin-type semiconductor region, wherein:
the impurity blocking portion is formed as part of the gate electrode, the impurity blocking portion being a protruding portion of the gate electrode,
an insulating sidewall spacer is formed on a side surface of the gate electrode, and
another impurity region is formed in the fin-type semiconductor region on both sides of the insulating sidewall spacer when viewed from the gate electrode.

2. The semiconductor device of claim 1, wherein a dimension of the gate electrode in a gate length direction is 45 nm or less.

3. The semiconductor device of claim 1, wherein a specific resistance of the impurity region formed in a side of the fin-type semiconductor region is no more than twice a specific resistance of the impurity region formed in an upper part of the fin-type semiconductor region.

4. The semiconductor device of claim 3, wherein the specific resistance of the impurity region formed in the side of the fin-type semiconductor region is no more than 1.25 times the specific resistance of the impurity region formed in the upper part of the fin-type semiconductor region.

5. The semiconductor device of claim 1, wherein a sheet resistance of the impurity region formed in a side of the fin-type semiconductor region is no more than twice a sheet resistance of the impurity region formed in an upper part of the fin-type semiconductor region.

6. The semiconductor device of claim 5, wherein the sheet resistance of the impurity region formed in the side of the fin-type semiconductor region is no more than 1.25 times the sheet resistance of the impurity region formed in the upper part of the fin-type semiconductor region.

7. The semiconductor device of claim 1, wherein a spreading resistance of the impurity region formed in a side of the fin-type semiconductor region is no more than twice a spreading resistance of the impurity region formed in an upper part of the fin-type semiconductor region.

8. The semiconductor device of claim 7, wherein the spreading resistance of the impurity region formed in the side of the fin-type semiconductor region is no more than 1.25 times the spreading resistance of the impurity region formed in the upper part of the fin-type semiconductor region.

9. The semiconductor device of claim 1, wherein an insulating layer is formed between the substrate and the fin-type semiconductor region.

10. The semiconductor device of claim 1, wherein the substrate is a semiconductor substrate having a protrusion which serves as the fin-type semiconductor region.

11. The semiconductor device of claim 1, wherein the impurity region is an extension region.

12. The semiconductor device of claim 1, wherein the insulating sidewall spacer is formed on a side surface of the impurity blocking portion.

13. The semiconductor device of claim 1, wherein the another impurity region is a source/drain region.

14. The semiconductor device of claim 1, wherein a height of the fin-type semiconductor region is larger than a dimension of the fin-type semiconductor region in a gate width direction.

15. The semiconductor device of claim 1, further comprising:
a plurality of fin-type semiconductor regions formed over the substrate at a predetermined pitch,
wherein the gate electrode is formed so as to extend across each of the fin-type semiconductor regions, and the impurity blocking portion is not formed between the fin-type semiconductor regions.

16. The semiconductor device of claim 1, wherein the impurity blocking portion comprises a material which is same as a material of the gate electrode and a material which is different from the material of the gate electrode.

17. The semiconductor device of claim 16, wherein the impurity blocking portion which has the material different from the gate electrode includes an insulating material.

18. The semiconductor device of claim 16, wherein the gate electrode has a substantially uniform gate length in a gate width direction.

19. The semiconductor device of claim 16, wherein an insulating sidewall spacer is formed on a side surface of the impurity blocking portion.

20. The semiconductor device of claim 1, wherein a length of the fin-type semiconductor region in a gate width direction is about one third of a height of the fin-type semiconductor region.

21. The semiconductor device of claim 1, wherein the impurity region includes a source-side extension region and a drain-side extension region, and the distance between the source-side extension region and the drain-side extension region is substantially the same in a middle region of an upper part of the fin-type semiconductor region, and in upper corners and sides of the fin-type semiconductor region.

22. A semiconductor device, comprising:
a fin-type semiconductor region formed on a substrate;
a gate insulating film formed so as to cover an upper surface and both side surfaces of a predetermined portion of the fin-type semiconductor region;
a gate electrode formed on the gate insulating film;
an impurity region formed on both sides of the gate electrode in the fin-type semiconductor region; and
an impurity blocking portion for blocking the introduction of impurities, the impurity blocking portion being provided adjacent both sides of the gate electrode over an upper surface of the fin-type semiconductor region,
wherein a dimension of the impurity blocking portion in a gate width direction is smaller than that of the fin-type semiconductor region in the gate width direction.

23. The semiconductor device of claim 22, wherein the impurity blocking portion is formed as part of the gate electrode, the impurity blocking portion being a protruding portion of the gate electrode.

24. The semiconductor device of claim 22, wherein a dimension of the gate electrode in a gate length direction is 45 nm or less.

25. The semiconductor device of claim 22, wherein a specific resistance of the impurity region formed in a side of the fin-type semiconductor region is no more than twice a specific resistance of the impurity region formed in an upper part of the fin-type semiconductor region.

26. The semiconductor device of claim 25, wherein the specific resistance of the impurity region formed in the side of the fin-type semiconductor region is no more than 1.25 times the specific resistance of the impurity region formed in the upper part of the fin-type semiconductor region.

27. The semiconductor device of claim 22, wherein a sheet resistance of the impurity region formed in a side of the fin-type semiconductor region is no more than twice a sheet resistance of the impurity region formed in an upper part of the fin-type semiconductor region.

28. The semiconductor device of claim 27, wherein the sheet resistance of the impurity region formed in the side of the fin-type semiconductor region is no more than 1.25 times the sheet resistance of the impurity region formed in the upper part of the fin-type semiconductor region.

29. The semiconductor device of claim 22, wherein a spreading resistance of the impurity region formed in a side of the fin-type semiconductor region is no more than twice a spreading resistance of the impurity region formed in an upper part of the fin-type semiconductor region.

30. The semiconductor device of claim 29, wherein the spreading resistance of the impurity region formed in the side of the fin-type semiconductor region is no more than 1.25 times the spreading resistance of the impurity region formed in the upper part of the fin-type semiconductor region.

31. The semiconductor device of claim 22, wherein an insulating layer is formed between the substrate and the fin-type semiconductor region.

32. The semiconductor device of claim 22, wherein the substrate is a semiconductor substrate having a protrusion which serves as the fin-type semiconductor region.

33. The semiconductor device of claim 22, wherein the impurity region is an extension region.

34. The semiconductor device of claim 22, wherein an insulating sidewall spacer is formed on a side surface of the gate electrode.

35. The semiconductor device of claim 34, wherein the insulating sidewall spacer is formed on a side surface of the impurity blocking portion.

36. The semiconductor device of claim 34, wherein another impurity region is formed in the fin-type semiconductor region on both sides of the insulating sidewall spacer when viewed from the gate electrode.

37. The semiconductor device of claim 36, wherein the another impurity region is a source/drain region.

38. The semiconductor device of claim 22, wherein a height of the fin-type semiconductor region is larger than a dimension of the fin-type semiconductor region in a gate width direction.

39. The semiconductor device of claim 22, further comprising:
a plurality of fin-type semiconductor regions formed over the substrate at a predetermined pitch,
wherein the gate electrode is formed so as to extend across each of the fin-type semiconductor regions, and
the impurity blocking portion is not formed between the fin-type semiconductor regions.

40. The semiconductor device of claim 22, wherein the impurity blocking portion comprises a material which is different from the material of the gate electrode.

41. The semiconductor device of claim 40, wherein the impurity blocking portion is formed of an insulating material.

42. The semiconductor device of claim 40, wherein the gate electrode has a substantially uniform gate length in a gate width direction.

43. The semiconductor device of claim 40, wherein an insulating sidewall spacer is formed on a side surface of the impurity blocking portion.

44. The semiconductor device of claim 22, wherein a length of the fin-type semiconductor region in a gate width direction is about one third of a height of the fin-type semiconductor region.

45. The semiconductor device of claim 22, wherein the impurity region includes a source-side extension region and a drain-side extension region, and the distance between the source-side extension region and the drain-side extension region is substantially the same in a middle region of an upper part of the fin-type semiconductor region, and in upper corners and sides of the fin-type semiconductor region.

* * * * *